United States Patent
Park et al.

(10) Patent No.: US 11,488,536 B2
(45) Date of Patent: Nov. 1, 2022

(54) DISPLAY APPARATUS

(71) Applicant: SAMSUNG DISPLAY CO., LTD., Yongin-si (KR)

(72) Inventors: Okkyung Park, Yongin-si (KR); Sunho Kim, Yongin-si (KR); Juchan Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/335,246

(22) Filed: Jun. 1, 2021

(65) Prior Publication Data

US 2021/0398488 A1 Dec. 23, 2021

(30) Foreign Application Priority Data

Jun. 19, 2020 (KR) .................. 10-2020-0074954

(51) Int. Cl.
  *G09G 3/3258* (2016.01)
  *H01L 27/32* (2006.01)

(52) U.S. Cl.
  CPC ....... *G09G 3/3258* (2013.01); *H01L 27/3246* (2013.01); *H01L 27/3276* (2013.01)

(58) Field of Classification Search
  CPC .. G09G 3/3258; G09G 3/3291; G09G 3/3233; H01L 27/3246; H01L 27/3276
  See application file for complete search history.

(56) References Cited

U.S. PATENT DOCUMENTS

| | | | |
|---|---|---|---|
| 9,336,709 B2* | 5/2016 | Lin ..................... | H01L 27/3276 |
| 10,147,777 B2 | 12/2018 | Lim et al. | |
| 10,304,913 B2 | 5/2019 | Choi et al. | |
| 10,845,629 B2* | 11/2020 | Tamaki ................ | G09G 3/3651 |
| 2011/0248968 A1* | 10/2011 | Suh ..................... | H01L 27/3276 345/204 |
| 2016/0125809 A1 | 5/2016 | Hwang | |
| 2017/0154943 A1* | 6/2017 | Yang .................... | H01L 27/3276 |
| 2017/0294155 A1* | 10/2017 | Kim ..................... | H01L 27/3248 |
| 2021/0020716 A1 | 1/2021 | Kim et al. | |

FOREIGN PATENT DOCUMENTS

| | | |
|---|---|---|
| KR | 1020160052943 A | 5/2016 |
| KR | 1020170066767 A | 6/2017 |
| KR | 1020180018960 A | 2/2018 |
| KR | 1020190047565 A | 5/2019 |
| KR | 1020200036290 A | 4/2020 |
| KR | 1020210010716 A | 1/2021 |

* cited by examiner

*Primary Examiner* — Sardis F Azongha
(74) *Attorney, Agent, or Firm* — Cantor Colburn LLP

(57) ABSTRACT

A display apparatus includes a substrate including a first area and a second area surrounded by the first area, a first gate driving circuit unit and a second gate driving circuit unit adjacent to and spaced apart from each other in the first area, a $(1\text{-}1)^{st}$ pixel circuit unit arranged between the first gate driving circuit unit and the second gate driving circuit unit, and a $(1\text{-}1)^{st}$ display element arranged in the first area and electrically connected to the $(1\text{-}1)^{st}$ pixel circuit unit.

18 Claims, 15 Drawing Sheets

DISPLAY APPARATUS

This application claims priority to Korean Patent Application No. 10-2020-0074954, filed on Jun. 19, 2020, and all the benefits accruing therefrom under 35 U.S.C. § 119, the content of which in its entirety is herein incorporated by reference.

BACKGROUND

1. Field

One or more embodiments relate to a display apparatus.

2. Description of Related Art

A display apparatus visually displays data. The display apparatus may be used as a display unit of a small product such as a mobile phone or as a display unit of a large product such as a television.

Such a display apparatus includes a substrate partitioned into a display area and a non-display area, and a gate line and a data line are formed insulated from each other in the display area. The gate line and the data line intersect each other to define a plurality of pixel areas in the display area, and the plurality of pixel areas receive electrical signals and emit light to externally display an image. A thin-film transistor and a pixel electrode electrically connected to the thin-film transistor are provided to correspond to each pixel area, and an opposite electrode is commonly provided in the pixel areas. Various lines for transmitting electrical signals to the display area, a gate driver, a data driver, and a controller, etc. may be provided in the non-display area.

The use of the display apparatus has diversified. In addition, because the display apparatus has become thinner and lighter, its range of use is expanding. As the number of users increases, research has been actively conducted to provide visual satisfaction to the users, for example, by expanding the display area of the display apparatus. As such, various studies have been attempted to expand the display area of the display apparatus.

SUMMARY

One or more embodiments include a display apparatus in which a non-display area is reduced. However, the above-described objective is only an example, and the scope of the present disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate including a first area and a second area surrounded by the first area, a first gate driving circuit unit and a second gate driving circuit unit adjacent to and spaced apart from each other in the first area, a $(1-1)^{st}$ pixel circuit unit arranged between the first gate driving circuit unit and the second gate driving circuit unit, and a $(1-1)^{st}$ display element arranged in the first area and electrically connected to the $(1-1)^{st}$ pixel circuit unit.

The $(1-1)^{st}$ display element may at least partially overlap the first gate driving circuit unit in a plan view.

The display apparatus may further include a second pixel circuit unit arranged in the second area, and a second display element arranged in the second area and electrically connected to the second pixel circuit unit.

The display apparatus may further include a data line arranged on the substrate and extending in a first direction, where the sum of a length of the first gate driving circuit unit in the first direction and a length of the $(1-1)^{st}$ pixel circuit unit in the first direction may be less than or equal to a length of the second pixel circuit unit in the first direction.

The display apparatus may further include a first gate line connected to the first gate driving circuit unit and extending in the first area, and a second gate line connected to the first gate driving circuit unit and extending in the second area.

The display apparatus may further include a $(1-2)^{nd}$ display element arranged in the first area and electrically connected to the $(1-1)^{st}$ pixel circuit unit.

The $(1-1)^{st}$ display element may at least partially overlap the first gate driving circuit unit in the plan view, and the $(1-2)^{nd}$ display element may at least partially overlap the second gate driving circuit unit in the plan view.

The $(1-1)^{st}$ display element may at least partially overlap the first gate driving circuit unit in the plan view, and the $(1-2)^{nd}$ display element may at least partially overlap the $(1-1)^{st}$ pixel circuit unit in the plan view.

The $(1-1)^{st}$ display element and the $(1-2)^{nd}$ display element may each emit light in the same wavelength band.

The display apparatus may further include a $(1-2)^{nd}$ pixel circuit unit arranged between the $(1-1)^{st}$ pixel circuit unit and the second gate driving circuit unit, and a $(1-3)^{rd}$ display element electrically connected to the $(1-2)^{nd}$ pixel circuit unit, where the $(1-1)^{st}$ display element at least partially may overlap the first gate driving circuit unit in the plan view, and the $(1-3)^{rd}$ display element at least partially overlaps the second gate driving circuit unit in the plan view.

The display apparatus may further include a voltage line arranged between the $(1-1)^{st}$ pixel circuit unit and the $(1-2)^{nd}$ pixel circuit unit, where the voltage line may be connected to each of the $(1-1)^{st}$ pixel circuit unit and the $(1-2)^{nd}$ pixel circuit unit.

The $(1-1)^{st}$ display element may include a $(1-1)^{st}$ pixel electrode, a $(1-1)^{st}$ intermediate layer, and an opposite electrode. The display apparatus may further include a pixel defining layer between the $(1-1)^{st}$ pixel electrode and the opposite electrode, and the pixel defining layer may define a $(1-1)^{st}$ opening defining a $(1-1)^{st}$ emission area of the $(1-1)^{st}$ display element by exposing a portion of the $(1-1)^{st}$ pixel electrode, and the first gate driving circuit unit may at least partially overlap the $(1-1)^{st}$ emission area in the plan view.

The display apparatus may further include a $(1-2)^{nd}$ display element arranged in the first area and electrically connected to the $(1-1)^{st}$ pixel circuit unit, where the pixel defining layer may define a $(1-2)^{nd}$ opening defining a $(1-2)^{nd}$ emission area of the $(1-2)^{nd}$ display element by exposing a portion of the $(1-1)^{st}$ pixel electrode, and the $(1-2)^{nd}$ emission area at least partially may overlap one of the $(1-1)^{st}$ pixel circuit unit or the second gate driving circuit unit in the plan view.

The display apparatus may further include a second pixel circuit unit arranged on the substrate to correspond to the second area, and a second display element electrically connected to the second pixel circuit unit, where the second display element may include a second pixel electrode, a second intermediate layer, and the opposite electrode in the second area. The pixel defining layer may further define a second opening defining a second emission area of the second display element by exposing a portion of the second pixel electrode, and a size of the $(1-1)^{st}$ opening may be less than a size of the second opening.

One or more embodiments include a display apparatus including a substrate including a first area and a second area surrounded by the first area, a first gate driving circuit unit arranged in the first area, a $(1\text{-}1)^{st}$ pixel circuit unit arranged in the first area and adjacent to the outside of the substrate than the first gate driving circuit unit in a second direction, and a $(1\text{-}1)^{st}$ display element arranged in the first area and electrically connected to the $(1\text{-}1)^{st}$ pixel circuit unit.

The $(1\text{-}1)^{st}$ display element may at least partially overlap the first gate driving circuit unit in a plan view.

The display apparatus may further include a second gate driving circuit unit arranged in the first area, a $(1\text{-}2)^{nd}$ pixel circuit unit arranged in the first area and adjacent to the second area than the second gate driving circuit unit, and a $(1\text{-}2)^{nd}$ display element arranged in the first area and electrically connected to the $(1\text{-}2)^{nd}$ pixel circuit unit.

The $(1\text{-}1)^{st}$ display element may at least partially overlap the first gate driving circuit unit in the plan view, and the $(1\text{-}2)^{nd}$ display element may at least partially overlap the second gate driving circuit unit in the plan view.

The display apparatus may further include a first gate line connected to the first gate driving circuit unit and extended toward the outside of the substrate in the second direction, and a second gate line connected to the first gate driving circuit unit and extended toward the second area in the second direction.

The sum of a length of the first gate driving circuit unit in the second direction and a length of the $(1\text{-}1)^{st}$ pixel circuit unit in the second direction may be equal to the sum of a length of the second gate driving circuit unit and a length of the $(1\text{-}2)^{nd}$ pixel circuit unit in respect to the second direction.

These and/or other aspects, features, and advantages will become apparent and more readily appreciated from the following detailed description, claims and drawings for carrying out the following embodiments.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
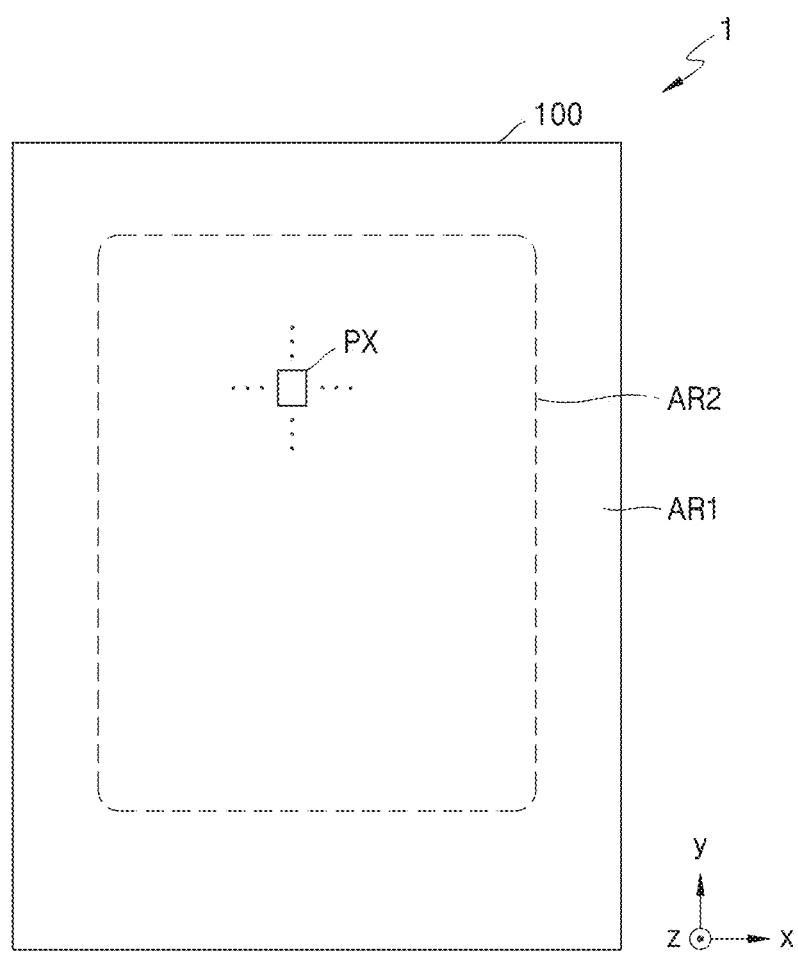
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As embodiments allow for various changes and numerous embodiments, example embodiments will be illustrated in the drawings and described in detail in the written description. Effects and features of the present disclosure and methods of achieving them will be apparent with reference to embodiments and drawings described below in detail. However, the present disclosure may be embodied in many different forms and should not be construed as limited to the example embodiments set forth herein.

Hereinafter, the embodiments of the present disclosure will now be described more fully with reference to the accompanying drawings. Like reference numerals in the drawings denote like elements, and thus descriptions thereof will be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present embodiment, an expression such as "A and/or B" indicates A, B, or A and B. In addition, an expression such as "at least one of A and B" indicates A, B, or A and B.

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view schematically illustrating a display apparatus 1 according to an embodiment.

Referring to FIG. 1, the display apparatus 1 includes a first area AR1 and a second area AR2. The second area AR2 may be surrounded by the first area AR1. The display apparatus 1 may provide images to the outside by using light emitted from the first area AR1 and the second area AR2. Because the display apparatus 1 includes a substrate 100, it can be said that the substrate 100 has such first area AR1 and second area AR2.

The substrate 100 may include or be made of various materials such as glass, metal, or plastic. According to an embodiment, the substrate 100 may include a flexible material. Here, the flexible material refers to a material that is well twisted, bent, and can be folded or rolled. The substrate 100 of the flexible material may include or be made of ultra-thin glass, metal, or plastic.

Pixels PX having various display elements such as organic light-emitting diodes ("OLEDs") may be arranged in the first area AR1 and the second area AR2 of the substrate 100. The pixels PX may be plural, and the plurality of pixels PX may be arranged in various forms such as a stripe arrangement, a pentile arrangement, and a mosaic arrangement, to implement an image.

Various lines for transmitting electrical signals to be applied to the second area AR2, a printed circuit board, or pads to which a driver IC chip is attached may be located in the first area AR1 of the substrate 100.

When viewing the second area AR2 of the substrate 100 in a plane shape (i.e., in a plan view), the second area AR2 may have a rectangular shape as shown in FIG. 1. In another embodiment, the second area AR2 may have a polygonal shape such as a triangular shape, a pentagonal shape, or a hexagonal shape, a circular shape, an elliptical shape, or an irregular shape.

As a comparative example, pixels may not be arranged in an outer region of the display apparatus in which a printed circuit board or pad is located. In this case, only a portion of the area surrounded by the outer area (i.e., first area AR1) of the display apparatus corresponds to an area (i.e., second area AR2) for displaying an image.

However, when a plurality of pixels PX is arranged in the first area AR1 in which a printed circuit board or pads to which a driver IC chip is attached according to an embodiment of the disclosure, the area for displaying an image may extend from the second area AR2 to the first area AR1 in which the plurality of pixels PX is arranged. The non-display area may be reduced by the first area AR1 in which the plurality of pixels PX is arranged.

Figure 2:
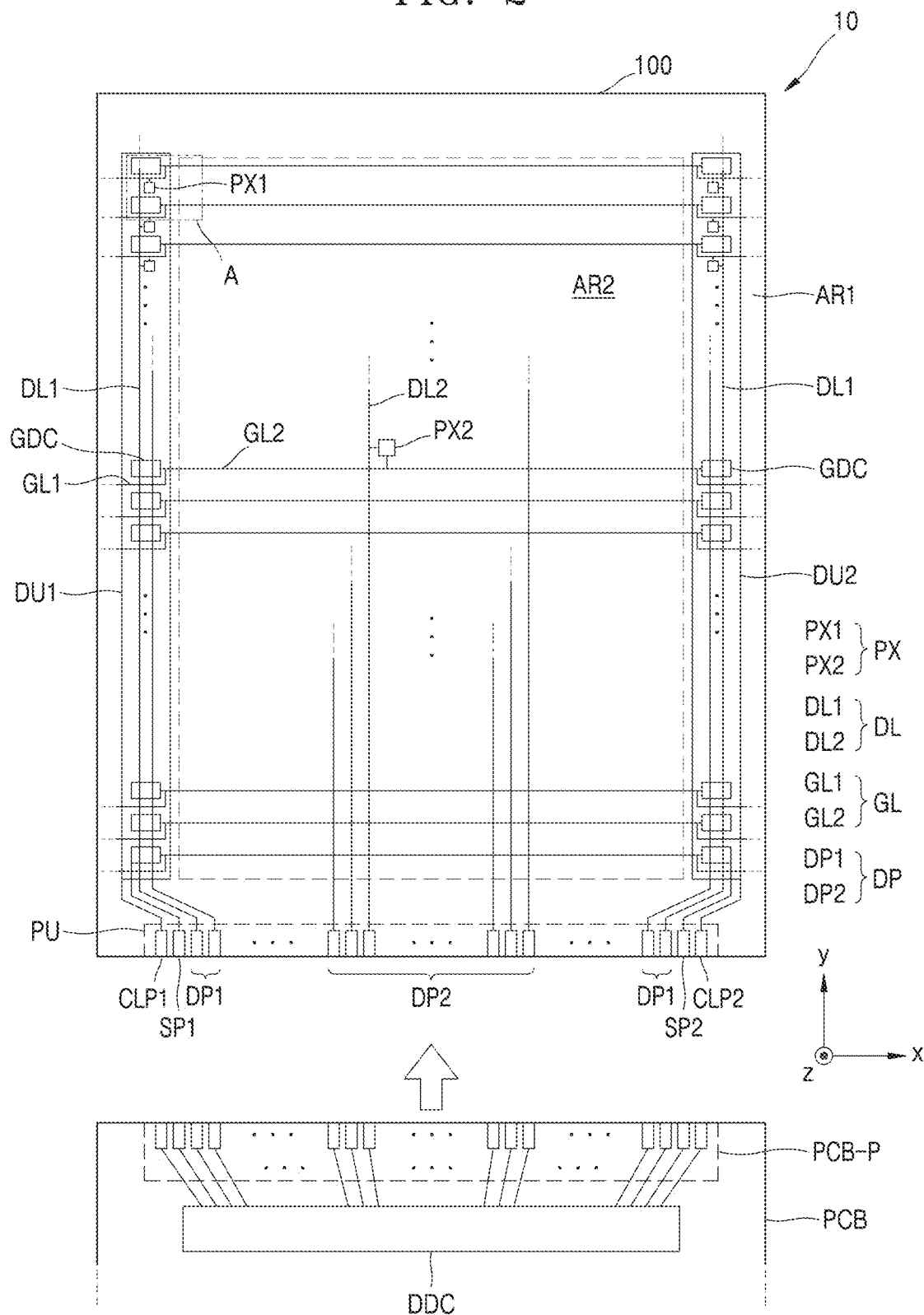
FIG. 2 is a plan view schematically illustrating a display panel according to an embodiment.

FIG. 2 is a plan view schematically illustrating a display panel 10 according to an embodiment.

Referring to FIG. 2, the display panel 10 includes a first area AR1 and a second area AR2 surrounded by the first area AR1, and may include a plurality of first pixels PX1 in the first area AR1 and a plurality of second pixels PX2 in the second area AR2. The broken lines in FIG. 2 is the border between the first area AR1 and the second area AR2. The display panel 10 may include a plurality of data lines DL and a plurality of gate lines GL, the plurality of data lines DL extending in a first direction (for example, the y direction) and connected to pixels PX positioned in the same column, respectively, from among the plurality of pixels PX, and the plurality of gate lines GL extending in a second direction (for example, the x direction) intersecting the first direction and connected to the pixels PX positioned in the same row, respectively, from among the plurality of pixels PX.

The plurality of pixels PX including the plurality of first pixels PX1 and the plurality of second pixels PX2 may each include a display element such as an organic light-emitting diode (OLED). Each of the pixels PX may emit light of, for example, red, green, blue, or white color through an organic light-emitting diode (OLED). Hereinafter, in the present specification, each of the pixels PX means a sub-pixel that emits light of different colors, which, for example, may be one of a red (R) sub-pixel, a green (G) sub-pixel, and a blue (B) sub-pixel. The first area AR1 and the second area AR2 may be covered with a sealing member (not shown) and protected from ambient air or moisture.

The pixels PX may be electrically connected to driving circuits arranged in the first area AR1, respectively. A first driving unit DU1, a second driving unit DU2, and a pad unit PU may be arranged in the first area AR1. Although not shown in FIG. 2, power supply lines may also be arranged in the first area AR1.

The first driving unit DU1 may include a plurality of gate driving circuit units GDC. The gate driving circuit units GDC may be arranged spaced apart from each other. The plurality of first pixels PX1 may be arranged in areas between the plurality of gate driving circuit units GDC that is spaced apart from each other. The plurality of gate driving circuit units GDC may be connected to the plurality of gate lines GL, respectively, extending in the second direction (e.g., the x-direction), and sequentially transfer, through the plurality of gate lines GL, an electrical signal to pixels PX arranged in the same row.

In FIG. 2, each of the plurality of gate lines GL is one line. However, each of the plurality of gate lines GL may be composed of a plurality of lines. Each of the plurality of gate lines GL may include an emission control line, a scan line, and the like. Through the plurality of gate lines GL, an emission control signal and a scan signal may be sequentially transmitted to the pixels PX positioned in the same row.

Each of the plurality of gate lines GL may include a first gate line GL1 and a second gate line GL2, where the first gate line GL1 extends to the first area AR1 and the second gate line GL2 extends to the second area AR2.

The first gate line GL1 and the second gate line GL2 may be connected to the gate driving circuit unit GDC. The first gate line GL1 and the second gate line GL2 may be integrally formed. The first gate line GL1 may be connected to the first pixels PX1 located in the same row of the plurality of first pixels PX1. The second gate line GL2 may be connected to the second pixels PX2 located in the same row of the plurality of second pixels PX2. The first gate line GL1 may at least partially overlap the first area AR1, and the second gate line GL2 may at least partially overlap the second area AR2 in a plan view.

The second driving unit DU2 may be in parallel with the first driving unit DU1 with the second area AR2 therebetween. As in the first driving unit DU1, the second driving unit DU2 may include a plurality of gate driving circuit units GDC. The plurality of gate driving circuit units GDC may be connected to a plurality of gate lines GL extending in the second direction, respectively, and sequentially transmit, through the plurality of gate lines GL, electrical signals to pixels PX arranged in the same row.

In FIG. 2, one end and the other end of each of the plurality of gate lines GL are connected to the gate driving circuit unit GDC of the first driving unit DU1 and the gate driving circuit unit GDC of the second driving unit DU2, respectively. However, each of the plurality of gate lines GL may be connected to one of the gate driving circuit unit GDC of the first driving unit DU1 and the gate driving circuit unit GDC of the second driving unit DU2. For example, odd-numbered gate lines GL of the plurality of gate lines GL may be connected to the gate driving circuit unit GDC of the first driving unit DU1, and even-numbered gate lines GL of the plurality of gate lines GL may be connected to the second driving unit DU2 of the second driving unit DU2. As another example, the second driving unit DU2 may be omitted.

The pad unit PU may be arranged on one end of the substrate 100. The pad unit PU may be exposed by not being covered by an insulating layer, and may be electrically connected to a printed circuit board PCB. A terminal unit PCB-P of the printed circuit board PCB may be electrically connected to the pad unit PU of the display panel 10. The pad unit PU may include a first clock pad CLP1, a second clock pad CLP2, a first scan pad SP1, a second scan pad SP2, and a plurality of data pads DP. In FIG. 2, each of the first clock pad CLP1, the second clock pad CLP2, the first scan pad SP1, and the second scan pad SP2 is singular. However, each of the first clock pad CLP1, the second clock pad CLP2, the first scan pad SP1, and the second scan pad SP2 may be plural.

The first clock pad CLP1 is connected to a plurality of gate driving circuit units GDC included in the first driving unit DU1, and transfers a first clock signal to the plurality of gate driving circuit units GDC. The plurality of gate driving circuit units GDC sequentially transmit a first gate signal to the plurality of gate lines GL based on the first clock signal received from the first clock pad CLP1. Although not shown in FIG. 2, each of the plurality of gate driving circuit units GDC is connected to the previous gate line and receives a previous gate signal from the previous gate line. According to another example, each of the plurality of gate driving circuit units GDC may be connected to a previous gate driving circuit unit, and may receive a previous control signal from the previous gate driving circuit unit.

The embodiment has been described based on the first clock pad CLP1, but the same may be applied to the second clock pad CLP2 as well. The second clock pad CLP2 may be arranged spaced apart from the first clock pad CLP1 with the first scan pad SP1, the second scan pad SP2, a plurality of first data pads DP1, and a plurality of second data pads DP2 therebetween. The second clock pad CLP2 is connected to a plurality of gate driving circuit units GDC included in the second driving unit DU2, and transmits a second clock signal to the plurality of gate driving circuit units GDC. The plurality of gate driving circuit units GDC sequentially transmit a second gate signal to the plurality of gate lines GL based on a second clock signal received from the second clock pad CLP2. At this time, the first clock signal and the second clock signal may be synchronized with each other, and the first gate signal and the second gate signal may be synchronized with each other.

The first scan pad SP1 may be connected to the first gate driving circuit unit GDC1 of the plurality of gate driving circuit units GDC included in the first driving unit DU1. The second scan pad SP2 may be connected to the first gate driving circuit unit GDC1 of the plurality of gate driving circuit units GDC included in the second driving unit DU2.

The plurality of data lines DL extend in a first direction (for example, the y direction), and may include the plurality of first data lines DL1 and the plurality of second data lines DL2, where the plurality of first data lines DL1 is located in the first area AR1 and the plurality of second data lines DL2 is located in the second area AR2. The plurality of first data lines DL1 may be connected to each of the first pixels PX1 located in the same column of the plurality of first pixels PX1, and the plurality of second data lines DL2 may be connected to each of the second pixels PX2 located in the same column of the plurality of second pixels PX2.

The plurality of data pads DP may be arranged between the first scan pad SP1 and the second scan pad SP2. The plurality of data pads DP may include a plurality of first data pads DP1 and a plurality of second data pads DP2, the plurality of first data pads DP1 each is connected to a corresponding first data line DL1 of the plurality of first data lines DL1 and the plurality of second data pads DP2 each is connected to a corresponding second data line DL2 of the plurality of second data lines DL2. In FIG. 2, each of the plurality of data pads DP corresponds to a different data line DL of the plurality of data lines DL, but each of the plurality of data lines DL may not correspond to a different data pad DP of the plurality of data pads DP. For example, some of the plurality of data lines DL may be connected, through a multiplexer, to same data pad DP among the plurality of data pads DP.

The display apparatus 1 (see FIG. 1) may include a printed circuit board PCB on which a display driving circuit DDC is mounted. The display driving circuit DDC may include a timing controller ("TCON"), a data driving circuit, and the like.

The printed circuit board PCB is mounted on the pad unit PU, and the terminal unit PCB-P of the printed circuit board PCB may be electrically connected to the pad unit PU of the display panel 10. The printed circuit board PCB includes lines to be connected to each of the first clock pad CLP1, the second clock pad CLP2, the first scan pad SP1, the second scan pad SP2, and the plurality of data pads DP, and may transfer a signal or power of the controller to the display panel 10.

Figure 3:
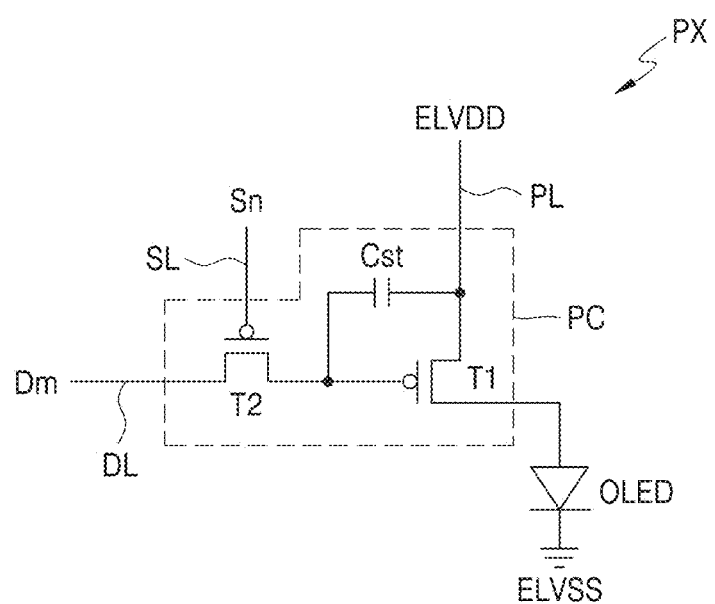
FIG. 3 is an equivalent circuit diagram of a pixel arranged on a display panel, according to an embodiment.

FIG. 3 is an equivalent circuit diagram of one pixel arranged on a display panel, according to an embodiment.

Referring to FIG. 3, each of the pixels PX includes a pixel circuit PC and an organic light-emitting diode OLED, where the pixel circuit PC is connected to a scan line SL and a data line DL and the organic light-emitting diode OLED is connected to the pixel circuit PC. The cathode of the organic light-emitting diode OLED may be a common electrode to which a common voltage ELVSS is applied.

The pixel circuit PC includes a driving thin-film transistor T1, a scanning thin-film transistor T2, and a storage capacitor Cst. The scanning thin-film transistor T2 is connected to the scan line SL and the data line DL, and transmits a data voltage Dm input through the data line DL according to a scan signal Sn received through the scan line SL.

The storage capacitor Cst is connected to the scanning thin-film transistor T2 and a driving voltage line PL, and stores a voltage corresponding to the difference between a voltage received from the scanning thin-film transistor T2 and a driving voltage ELVDD applied to the driving voltage line PL.

The driving thin-film transistor T1 is connected to the driving voltage line PL and the storage capacitor Cst, and may control a driving current flowing from the driving voltage line PL to the organic light-emitting diode OLED, the driving current corresponding to a voltage value stored in the storage capacitor Cst. The organic light-emitting diode OLED may emit light having a certain luminance according to a driving current.

In FIG. 3, the pixel circuit PC includes two thin-film transistors and one storage capacitor, but the present disclosure is not limited thereto. For example, the pixel circuit PC may include three or more thin-film transistors and/or two or more storage capacitors. In an embodiment, the pixel circuit PC may include seven thin-film transistors and one storage capacitor. This will be described below with reference to FIG. 4.

Figure 4:
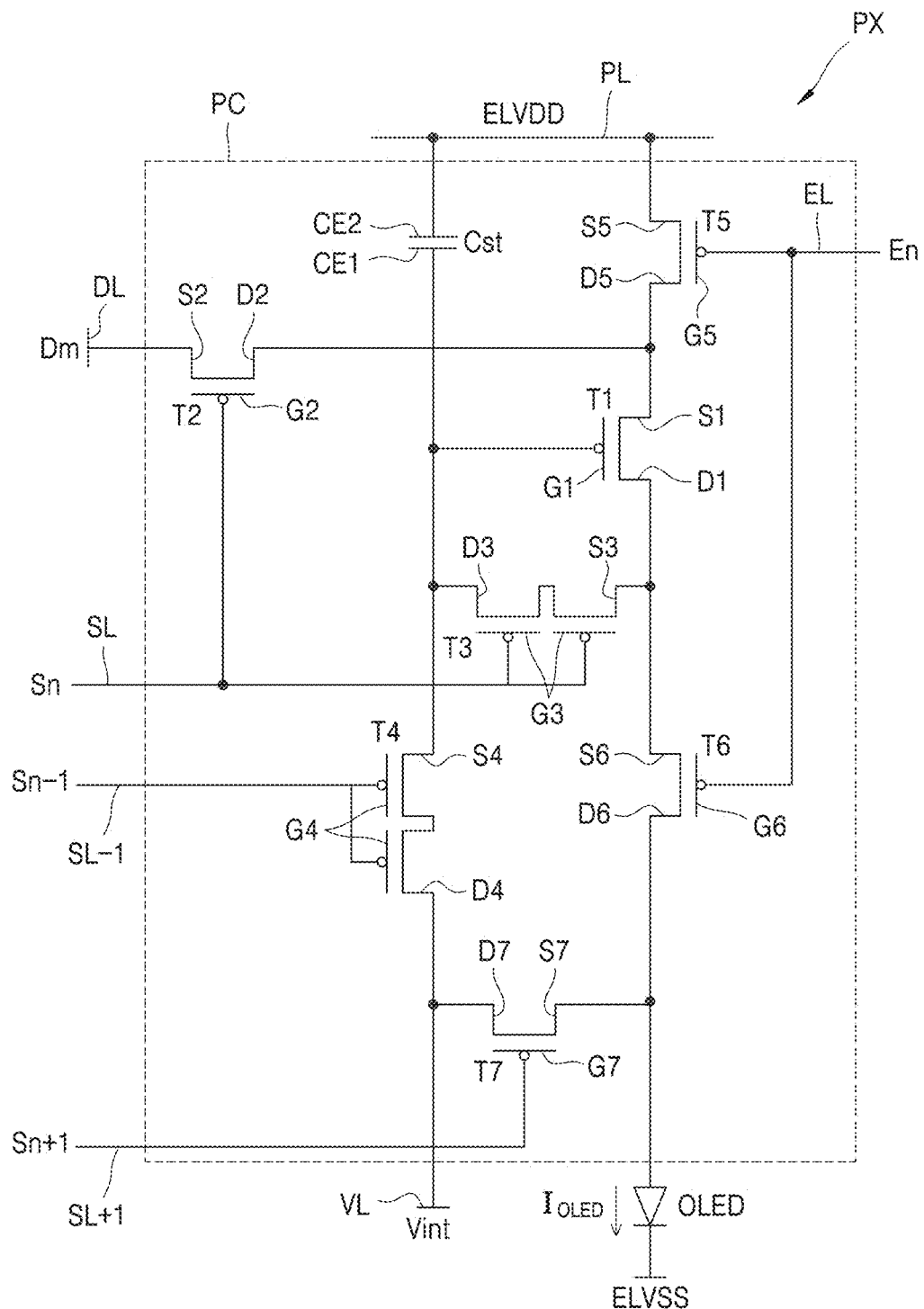
FIG. 4 is an equivalent circuit diagram of a pixel arranged on a display panel, according to an embodiment.

FIG. 4 is an equivalent circuit diagram of a pixel arranged on a display panel, according to an embodiment.

Referring to FIG. 4, each of the pixels PX may include a pixel circuit PC and an organic light-emitting diode OLED, where the organic light emitting diode OLED is electrically connected to the pixel circuit PC.

As an example, the pixel circuit PC, as shown in FIG. 4, includes first to seventh thin-film transistors T1 to T7 and a storage capacitor Cst. The first to seventh thin-film transistors T1 to T7 and the storage capacitor Cst are connected to first to third scan lines SL, SL−1, and SL+1 for transmitting first to third scan signals Sn, Sn−1, and Sn+1, respectively, a data line DL for transmitting a data voltage Dm, an emission control line EL for transmitting an emission control signal En, a driving voltage line PL for transmitting a driving voltage ELVDD, an initialization voltage line VL for transmitting an initialization voltage Vint, and a common electrode to which a common voltage ELVSS is applied.

The first thin-film transistor T1 may be a driving transistor in which a magnitude of drain current is determined according to a gate-source voltage, and the second to seventh thin-film transistors T2 to T7 may be a switching transistor that is turned on and off according to the gate-source voltage, substantially, the gate voltage.

The first thin-film transistor T1 may be referred to as a driving thin-film transistor, the second thin-film transistor T2 may be referred to as a scanning thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

Between the driving voltage line PL and a driving gate G1 of the driving thin-film transistor T1, the storage capacitor Cst is connected to the driving voltage line PL. The storage capacitor Cst may have an upper electrode CE2 connected to the driving voltage line PL and a bottom electrode CE1 connected to the driving gate G1 of the driving thin-film transistor T1.

The driving thin-film transistor T1 may control the magnitude of the driving current $I_{OLED}$ flowing from the driving voltage line PL to the organic light-emitting diode OLED according to the gate-source voltage. The driving thin-film transistor T1 may include the driving gate G1, a driving source S1, and a driving drain D1, where the driving gate G1 is connected to the bottom electrode CE1 of the storage capacitor Cst, the driving source S1 is connected to the driving voltage line PL through a first emission control thin-film transistor T5, and the driving drain D1 is connected to the organic light-emitting diode OLED through a second emission control thin-film transistor T6.

The driving thin-film transistor T1 may output a driving current $I_{OLED}$ to the organic light-emitting diode OLED according to the gate-source voltage. The magnitude of the driving current $I_{OLED}$ is determined based on the difference between a gate-source voltage and a threshold voltage of the driving thin-film transistor T1. The organic light-emitting diode OLED may receive the driving current $I_{OLED}$ from the driving thin-film transistor T1 and may emit light with brightness according to the magnitude of the driving current $I_{OLED}$.

The scanning thin-film transistor T2 transmits the data voltage Dm to the driving source S1 of the driving thin-film transistor T1 in response to the first scan signal Sn. The scanning thin-film transistor T2 includes a scan gate G2, a scan source S2 and a scan drain D2, where the scan gate G2 is connected to a first scan line SL, the scan source S2 is connected to the data line DL and the scan drain D2 is connected to the driving source S1 of the driving thin-film transistor T1.

The compensation thin-film transistor T3 is connected in series between the driving drain D1 and the driving gate G1 of the driving thin-film transistor T1, and connects the driving drain D1 to the driving gate G1 of the driving thin-film transistor T1 in response to the first scan signal Sn. The compensation thin-film transistor T3 includes a compensation gate G3, a compensation source S3, and a compensation drain D3, where the compensation gate G3 is connected to the first scan line SL, the compensation source S3 is connected to the driving drain D1 of the driving thin-film transistor T1, and the compensation drain D3 is connected to the driving gate G1 of the driving thin-film transistor T1. In FIG. 4, the compensation thin-film transistor T3 includes two thin-film transistors connected in series with each other, but the compensation thin-film transistor T3 may be composed of one thin-film transistor.

The gate initialization thin-film transistor T4 applies an initialization voltage Vint to the driving gate G1 of the driving thin-film transistor T1 in response to a second scan signal Sn−1. The gate initialization thin-film transistor T4 may include a first initialization gate G4 connected to a second scan line SL−1, a first initialization source S4 connected to the driving gate G1 of the driving thin-film transistor T1, and a first initialization drain D4 connected to an initialization voltage line VL. In FIG. 4, the gate initialization thin-film transistor T4 includes two thin-film transistors connected in series with each other, but the gate initialization thin-film transistor T4 may be composed of one thin-film transistor.

The anode initialization thin-film transistor T7 applies an initialization voltage Vint to the anode of the organic light-emitting diode OLED in response to the third scan signal Sn+1. The anode initialization thin-film transistor T7 may include a second initialization gate G7 connected to the third scan line SL+1, a second initialization source S7 connected to the anode of the organic light-emitting diode OLED, and a second initialization drain D7 connected to the initialization voltage line VL.

The first emission control thin-film transistor T5 may connect the driving voltage line PL and the driving source S1 of the driving thin-film transistor T1 to each other in response to the emission control signal En. The first emission control thin-film transistor T5 may include a first emission control gate G5 connected to the emission control line EL, a first emission control source S5 connected to the driving voltage line PL, and a first emission control drain D5 connected to the driving source S1 of the driving thin-film transistor T1.

The second emission control thin-film transistor T6 may connect the driving drain D1 of the driving thin-film transistor T1 to the anode of the organic light-emitting diode OLED in response to the emission control signal En. The second emission control thin-film transistor T6 may include a second emission control gate G6 connected to the emission control line EL, a second emission control source S6 connected to the driving drain D1 of the driving thin-film transistor T1, and a second emission control drain D6 connected to the anode of the organic light-emitting diode OLED.

The second scan signal Sn−1 may be substantially synchronized with the first scan signal Sn of the previous row. The third scan signal Sn+1 may be substantially synchronized with the first scan signal Sn. According to another example, the third scan signal Sn+1 may be substantially synchronized with the first scan signal Sn in the next row.

In the present embodiment, the first to seventh thin-film transistors T1 to T7 may include a semiconductor layer including silicon. For example, the first to seventh thin-film transistors T1 to T7 may include a semiconductor layer including low-temperature polycrystalline silicon ("LTPS"). The polycrystalline silicon material has high electron mobility (100 square centimeters per voltage-second ($cm^2/Vs$) or more), low energy consumption, and excellent reliability. As another example, semiconductor layers of the first to seventh thin-film transistors T1 to T7 include oxides of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layers of the first to seventh thin-film transistors T1 to T7 may be In—Sn—Zn—O ("ITZO") semiconductor layers, In—Ga—Zn—O ("IGZO") semiconductor layers, or the like. As another example, some semiconductor layers of the first to seventh thin-film transistors T1 to T7 may be formed of LTPS, and the other semiconductor layers may be formed of oxide semiconductors (e.g., IGZO).

A detailed operation process of each of the pixels PX of the display panel 10 according to an embodiment will now be described in detail. As illustrated in FIG. 4, it is assumed that the first to seventh thin-film transistors T1 to T7 are p-type metal-oxide-semiconductor field-effect transistors ("MOSFETs").

First, when a high-level emission control signal En is received, the first emission control thin-film transistor T5 and the second emission control thin-film transistor T6 are turned off, the driving thin-film transistor T1 stops the output of the driving current $I_{OLED}$, and the organic light-emitting diode OLED stops emitting light.

Thereafter, during a gate initialization period in which a low-level second scan signal Sn−1 is received, the gate initialization thin-film transistor T4 is turned on, and the initialization voltage Vint is applied to the driving gate G1 of the driving thin-film transistor T1, that is, the bottom electrode CE1 of the storage capacitor Cst. The difference between the driving voltage ELVDD and the initialization voltage Vint (ELVDD−Vint) is stored in the storage capacitor Cst.

Thereafter, during a data writing period in which a low-level first scan signal Sn is received, the scanning thin-film transistor T2 and the compensation thin-film transistor T3 are turned on, and the data voltage Dm is received in the driving source S1 of the driving thin-film transistor T1. The driving thin-film transistor T1 is diode-connected by using the compensation thin-film transistor T3, and biased forward. A gate voltage of the driving thin-film transistor T1 rises from the initialization voltage Vint. When the gate voltage of the driving thin-film transistor T1 is equal to a data compensation voltage (Dm−|Vth|), which is obtained by subtracting a threshold voltage Vth of the driving thin-film transistor T1 from the data voltage Dm, the driving thin-film transistor T1 is turned off, and the gate voltage of the driving thin-film transistor T1 stops rising. Accordingly, the difference (ELVDD−Dm+|Vth|) between the driving voltage ELVDD and the data compensation voltage (Dm−|Vth|) is stored in the storage capacitor Cst.

In addition, during an anode initialization period in which a low-level third scan signal Sn+1 is received, the anode initialization thin-film transistor T7 is turned on, and the initialization voltage Vint is applied to the anode of the organic light-emitting diode OLED. By applying the initialization voltage Vint to the anode of the organic light-emitting diode OLED, the organic light-emitting diode OLED does not emit fine light at all, and thereby, in the next frame, the pixel PX receives a data voltage Dm corresponding to black gradation, but the phenomenon that the OLED emits fine light may be eliminated.

The first scan signal Sn and the third scan signal Sn+1 may be substantially synchronized, and in this case, the data writing period and the anode initialization period may be the same period.

Then, when a low-level emission control signal En is received, the first emission control thin-film transistor T5 and the second emission control thin-film transistor T6 are turned on, the driving thin-film transistor T1 may output a driving current $I_{OLED}$ corresponding to the voltage stored in the storage capacitor Cst, that is, a voltage (ELVDD−Dm) obtained by subtracting the threshold voltage (|Vth|) of the driving thin-film transistor T1 from the source-gate voltage (ELVDD−Dm+|Vth|) of the driving thin-film transistor T1, and the organic light-emitting diode OLED may emit light with a luminance corresponding to the magnitude of the driving current $I_{OLED}$.

The operation process of one pixel PX of display panel 10 is described on the assumption that the first to seventh thin-film transistors T1 to T7 are p-type MOSFETs. However, in another example, some of the first to seventh thin-film transistors T1 to T7 may be formed of a p-type MOSFET, and the others may be formed of an n-type MOSFET.

Figure 5:
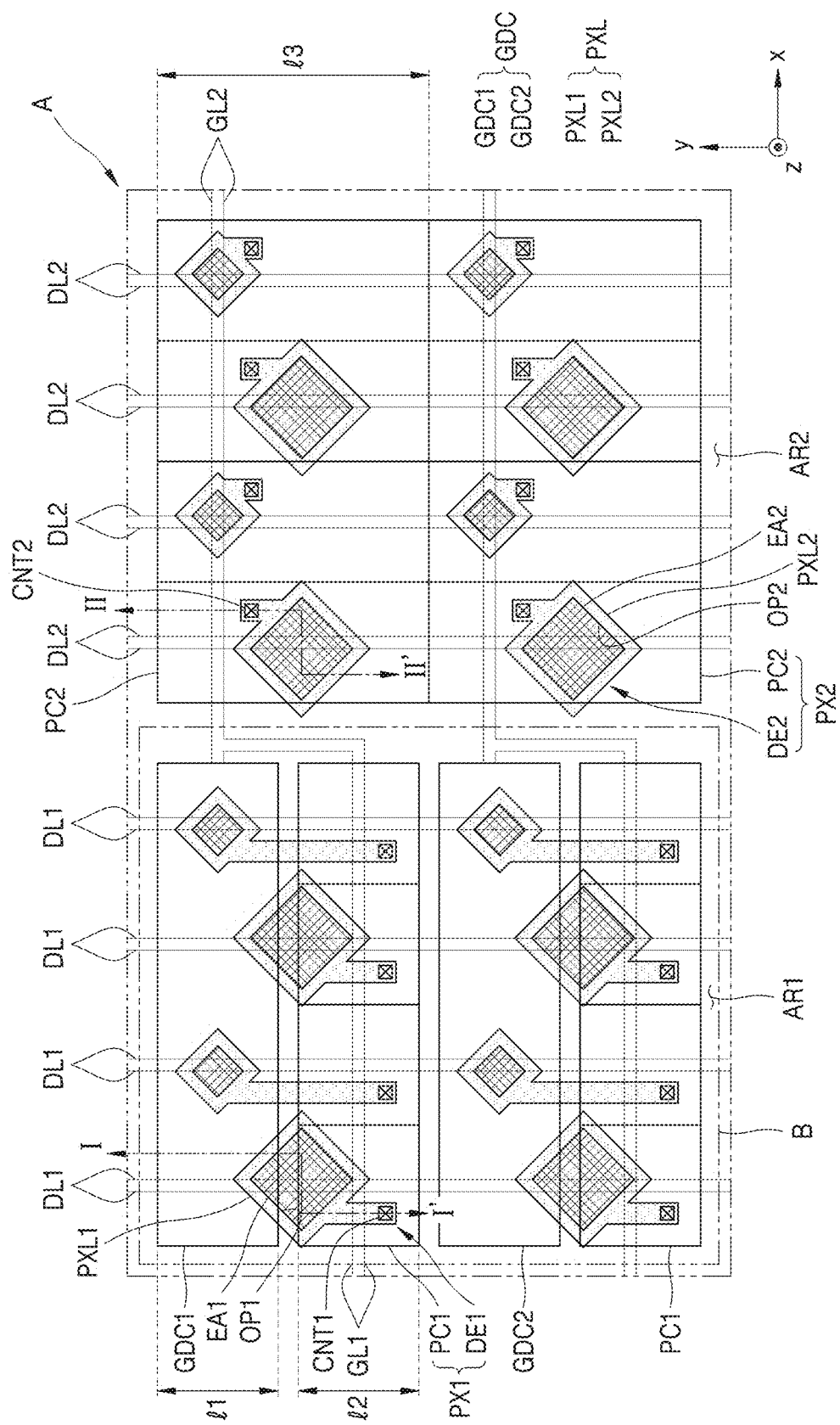
FIG. 5 is an enlarged plan view schematically illustrating part A of FIG. 2.
Figure 6:
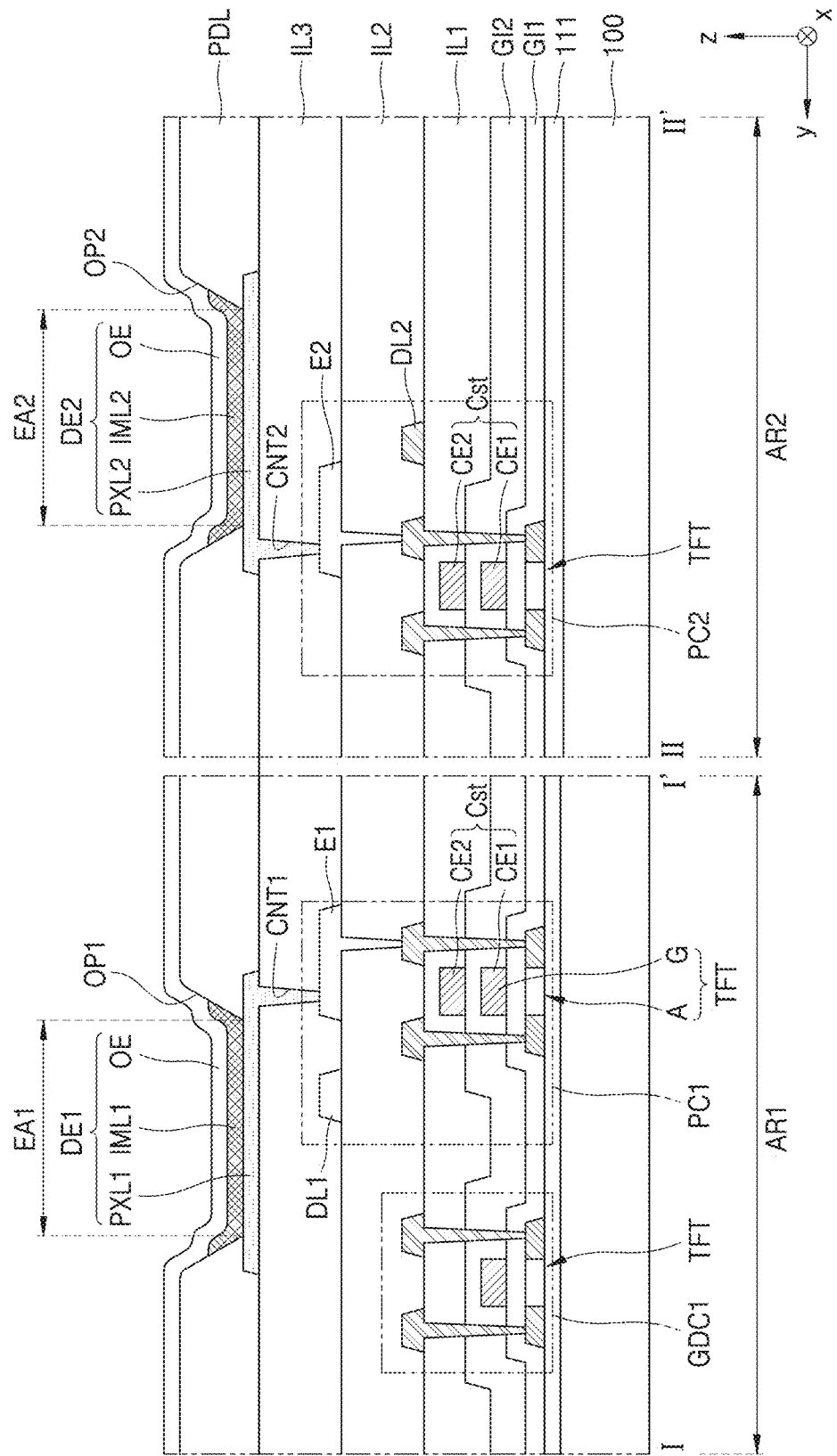
FIG. 6 is an exemplary cross-sectional view of the display panel of FIG. 5, taken along lines I-I' and II-II' in FIG. 5.
Figure 7:
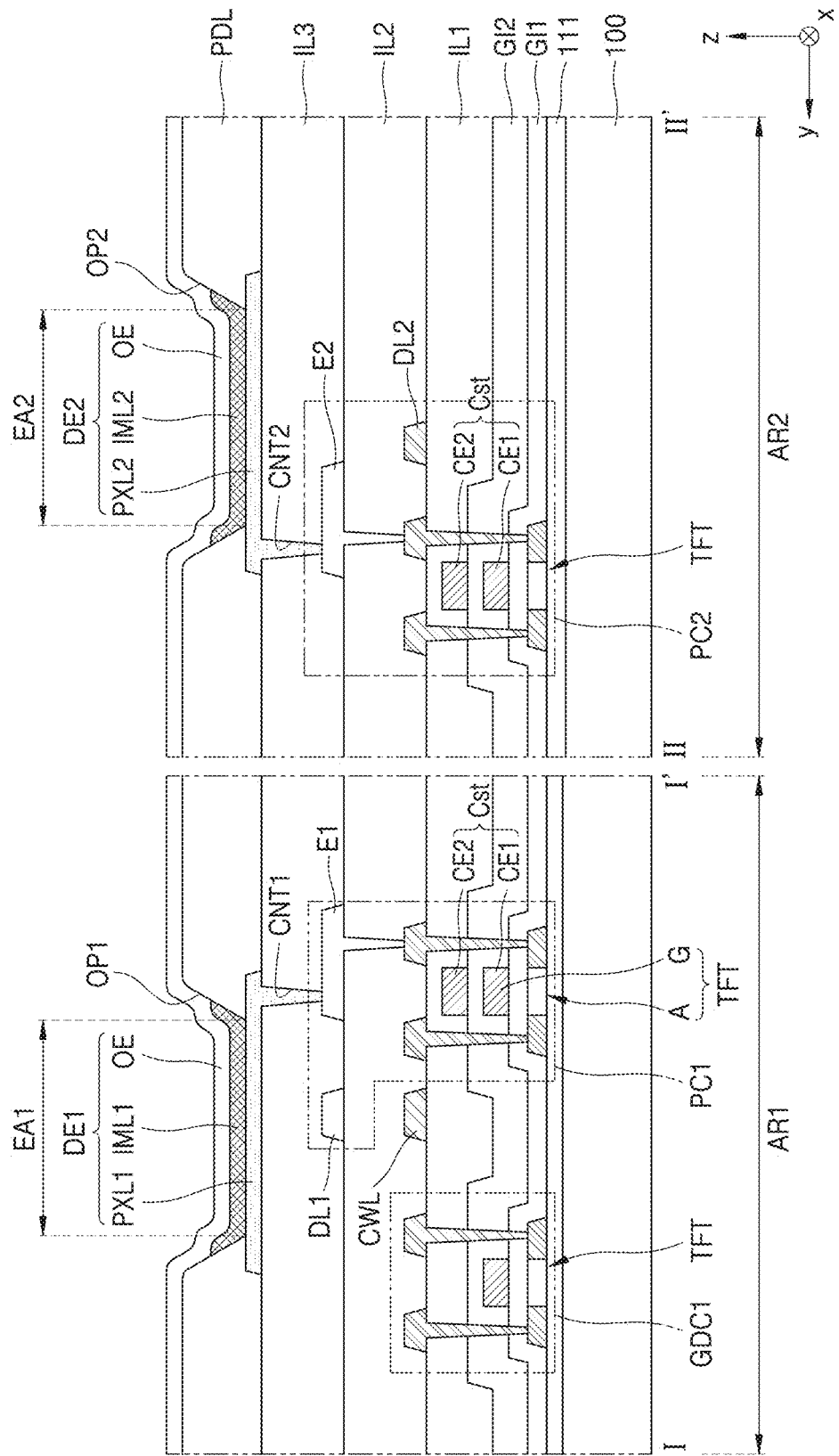
FIG. 7 is another exemplary cross-sectional view of the display panel of FIG. 5, taken along lines I-I' and II-II' in FIG. 5.

FIG. 5 is an enlarged plan view schematically illustrating part A of FIG. 2, and FIGS. 6 and 7 are exemplary cross-sectional views of the display panel of FIG. 5, taken along lines I-I' and II-II' in FIG. 5.

Referring to FIG. 5, the display apparatus 1 (see FIG. 1) may include a first gate driving circuit unit GDC1, a second gate driving circuit unit GDC2, a first pixel circuit unit PC1, a second pixel circuit unit PC2, a first data line DL1, a second data line DL2, a first gate line GL1, and a second gate line GL2.

The first gate driving circuit unit GDC1, the second gate driving circuit unit GDC2, the first pixel circuit unit PC1, the first data line DL1, and the first gate line GL1 may be located in the first area AR1, and the second pixel circuit unit PC2, the second data line DL2, and the second gate line GL2 may be located in the second area AR2.

The first gate driving circuit unit GDC1 and the second gate driving circuit unit GDC2 may be located on one side of the first area AR1. The first gate driving circuit unit GDC1 and the second gate driving circuit unit GDC2 may be arranged spaced apart from each other. The first gate driving circuit unit GDC1 and the second gate driving circuit unit GDC2 may be adjacent to each other. The first pixel circuit unit PC1 may be arranged in an area between the first gate driving circuit unit GDC1 and the second gate driving circuit unit GDC2.

Although not illustrated in FIG. 5, a gate driving circuit unit may be further arranged spaced apart from the second gate driving circuit unit GDC2 in such a way that the first gate driving circuit unit GDC1 and the second gate driving circuit unit GDC2 are spaced apart from each other. The first pixel circuit unit PC1 may also be arranged in an area between the second gate driving circuit unit GDC2 and the gate driving circuit unit, where the gate driving circuit unit is spaced apart from the second gate driving circuit unit GDC2. That is, the plurality of gate driving circuit units GDC may be arranged spaced apart from each other, and the first pixel circuit unit PC1 may be arranged between the plurality of gate driving circuit units GDC. The first pixel circuit unit PC1 may be plural, and the plurality of first pixel circuit units PC1 may be arranged side by side in the x direction.

The second pixel circuit unit PC2 may be arranged in the second area AR2, and may be plural. The plurality of second pixel circuit units PC2 may be arranged in the row direction (e.g., x direction) and the column direction (e.g., y direction), respectively.

The first data line DL1 and the second data line DL2 may each extend in a first direction (e.g., y direction).

The first data line DL1 is located in the first area AR1 and may overlap the gate driving circuit unit GDC and the first pixel circuit unit PC1 in a plan view. The first data line DL1 may be plural, and each of the plurality of first data lines DL1 may overlap the first pixel circuit units PC1 arranged in the same column. Each of the plurality of first data lines DL1 may be connected to the first pixel circuit units PC1 arranged in the same column.

The second data line DL2 is located in the second area AR2 and may overlap the second pixel circuit unit PC2. The second data line DL2 may be plural, and each of the plurality of second data lines DL2 may overlap the second pixel circuit unit PC2 arranged in the same column in a plan view. Each of the plurality of second data lines DL2 may be connected to second pixel circuit units PC2 arranged in the same column.

In an embodiment, as shown in FIG. 5, the sum of a length $\ell 1$ of the first gate driving circuit unit GDC1 for the first direction and a length 2 of the first pixel circuit unit PC1 for the first direction may be less than or equal to a length 3 of the second pixel circuit unit PC2 for the first direction (e.g., y direction). The area where the first pixel circuit unit PC1 is located may be less than the area where the second pixel circuit unit PC2 is located.

For example, the length $\ell 1$ of the first gate driving circuit unit GDC1 may be a distance between metal patterns which are most spaced apart in the first direction among metal patterns constituting the first gate driving circuit unit GDC1. Although the description has been made based on the first gate driving circuit unit GDC1, the first pixel circuit unit PC1 and the second pixel circuit unit PC2 may be equally applied.

The number of thin-film transistors included in the first pixel circuit unit PC1 may be less than or equal to the number of thin-film transistors included in the second pixel circuit unit PC2. For example, the first pixel circuit unit PC1 may include two thin-film transistors like the pixel circuit PC shown in FIG. 3, and the second pixel circuit unit PC2 may include seven thin-film transistors like the pixel circuit PC shown in FIG. 4. As another example, the first pixel circuit unit PC1 may include three thin-film transistors. As another example, the first pixel circuit unit PC1 includes seven thin-film transistors like the second pixel circuit unit PC2, but the configuration and arrangement of the seven thin-film transistors may be different from the configuration and arrangement of the second pixel circuit unit PC2.

The first gate line GL1 and the second gate line GL2 may be connected to the first gate driving circuit unit GDC1 and may be synchronized. The first gate line GL1 and the second gate line GL2 may each include an emission control line and a scan line. The first gate line GL1 extends to the first area AR1 and may overlap the first pixel circuit unit PC1 in a plan view. The second gate line GL2 extends to the second area AR2 and may overlap the second pixel circuit unit PC2. It has been described that the first gate line GL1 and the second gate line GL2 are each connected to the first gate driving circuit unit GDC1, but the embodiment may be applied the same to the first gate line GL1 and the second gate line GL2, where the first gate line GL1 and the second gate line GL2 each are connected to the second gate driving circuit unit GDC2.

The display apparatus 1 may include a first display element DE1 electrically connected to the first pixel circuit unit PC1, and a second display element DE2 electrically connected to the second pixel circuit unit PC2. The first display element DE1 may at least partially overlap the gate driving circuit unit GDC in a plan view.

The first display element DE1 may be connected to the first pixel circuit unit PC1 through a first contact hole CNT1, and the second display element DE2 may be connected to the second pixel circuit unit PC2 through a second contact hole CNT2.

The first display element DE1, as illustrated in FIG. 6, may include a first pixel electrode PXL1, a first intermediate layer IML1, and an opposite electrode OE. The first pixel electrode PXL1 may extend from the first contact hole CNT1 in the +y direction. A first opening OP1 defined in a pixel defining layer PDL to expose a portion of the first pixel electrode PXL1 may define a first emission area EA1. The first emission area EA1 defined by the first opening OP1 may be located in the +y direction relative to the first contact hole CNT1. The first emission area EA1 may overlap the gate driving circuit unit GDC in a plan view.

In FIG. 6, the first pixel electrode PXL1 extends in the +y direction from the first contact hole CNT1. However, as another example, the first pixel electrode PXL1 may extend in the −y direction from the first contact hole CNT1. The first emission area EA1 defined by the first opening OP1 may be located in the −y direction relative to the first contact hole CNT1.

The second display element DE2, as shown in FIG. 6, may include a second pixel electrode PXL2, a second intermediate layer IML2, and an opposite electrode OE. The second pixel electrode PXL2 may extend in the +y direction (i.e., left direction in FIG. 6) or −y direction (i.e., right direction in FIG. 6) from the second contact hole CNT2. A second opening OP2 defined in the pixel defining layer PDL to expose a portion of the second pixel electrode PXL2 may define a second emission area EA2. The second emission area EA2 defined by the second opening OP2 may be located in the +y direction or −y direction based on the second contact hole CNT2.

In FIG. 5, a first pixel PX1 and a second pixel PX2 are arranged in the form of a pentile array, the first pixel PX1 including the first pixel circuit unit PC1 and the first display element DE1 and the second pixel PX2 including the second pixel circuit unit PC2 and the second display element DE2. However, the first pixel PX1 and the second pixel PX2 may have various shapes such as a stripe arrangement and a mosaic arrangement.

Hereinafter, a configuration included in the display apparatus 1 will be described in more detail with reference to FIGS. 6 and 7 according to a stacked structure, and a positional relationship of the first data line DL1 and the second data line DL2 will be described.

The substrate 100 may include glass or polymer resin. Polymer resins include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including a polymer resin may have flexible, rollable, or bendable properties. The substrate 100 may be a multi-layer structure including a layer including the above-described polymer resin, and an inorganic layer (not shown).

A buffer layer 111 may reduce or block the penetration of foreign matter, moisture, or ambient air from the bottom of the substrate 100, and may provide a flat surface on the substrate 100. The buffer layer 111 may include an inorganic material such as an oxide or nitride, an organic material or an organic-inorganic composite, and may be formed of a single layer or multi-layer structure of the inorganic material and the organic material.

A barrier layer (not shown) may be further included between the substrate 100 and the buffer layer 111. The barrier layer may serve to prevent or significantly reduce impurities from the substrate 100 or the like penetrating into a semiconductor layer A. The barrier layer may include an inorganic material such as an oxide or nitride, an organic material or an organic-inorganic composite, and may be formed of a single layer or multi-layer structure of the inorganic material and the organic material.

The semiconductor layer A may be arranged on the buffer layer 111. The semiconductor layer A may include amorphous silicon or polysilicon. In another embodiment, the semiconductor layer A may include oxides of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer A may include a channel area, a source area, and a drain area, where the source area and the drain area are arranged on either side of the channel area. The semiconductor layer A may be composed of a single layer or multiple layers.

A first gate insulating layer GI1 and a second gate insulating layer G12 may be stacked on the substrate 100 to cover the semiconductor layer A. The first gate insulating layer G11 and the second gate insulating layer G12 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

A gate electrode G may be arranged on the first gate insulating layer GI1 to at least partially overlap with the semiconductor layer A in a plan view. In FIG. 6, the gate electrode G is arranged on the first gate insulating layer G11. However, in another embodiment, the gate electrode G may be arranged on the front side of the second gate insulating layer G12.

The gate electrode G may be formed of a single layer or multiple layers of at least one metal selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The first pixel circuit unit PC1 and the second pixel circuit unit PC2 may each include a storage capacitor Cst. The storage capacitor Cst is provided with a bottom electrode CE1 and an upper electrode CE2, and as shown in FIG. 6, may overlap a thin-film transistor TFT. For example, the gate electrode G of the thin-film transistor TFT may function as the bottom electrode CE1 of the storage capacitor Cst. Alternatively, the storage capacitor Cst may not overlap the thin-film transistor TFT in a plan view and may exist separately.

The upper electrode CE2 of the storage capacitor Cst overlaps the bottom electrode CE1 with the second gate insulating layer G12 therebetween, and forms a capacitance. In this case, the second gate insulating layer G12 may function as a dielectric layer of the storage capacitor Cst.

A first insulating layer IL1 may be provided on the second gate insulating layer G12 to cover the upper electrode CE2 of the storage capacitor Cst. The first insulating layer IL1 may include $SiO_2$, $SiN_X$, SiON, $Al_2O_3$, $TiO_2$, $Ta_2O_5$, $HfO_2$, or ZnO, and the like. In addition, the first insulating layer IL1 may include an organic material. For example, general-purpose polymers such as benzocyclobutene ("BCB"), polyimide, hexamethyldisiloxane ("HMDSO"), poly(methyl methacrylate) ("PMMA") or polystyrene ("PS"), polymer derivatives having phenolic groups, acrylic polymers, imide polymers, arylether polymers, amide polymers, fluorine polymers, p-xylene polymers, vinyl alcohol polymers, and blends thereof.

A source electrode, a drain electrode, and a second data line DL2 may be arranged on the first insulating layer IL1. In an embodiment, as shown in FIG. 7, a clock line CWL may also be arranged on the first insulating layer IL1. The clock line CWL may transfer, to the gate driving circuit unit GDC, clock signals transmitted from the first clock pad CLP1 and the second clock pad CLP2 of FIG. 2. The clock line CWL may be plural.

The source electrode, the drain electrode, the second data line DL2, and the clock line CWL may include a conductive material including Mo, Al, Cu, Ti, or the like, and may be formed of a multi-layer or a single layer including the above material. For example, the source electrode, the drain electrode, the second data line DL2, and the clock line CWL may be formed of a multi-layer structure of Ti/Al/Ti. The source electrode and the drain electrode may be connected to the source area or the drain area of the semiconductor layer A through a contact hole.

The source electrode, the drain electrode, the second data line DL2, and the clock line CWL may be covered with an inorganic protective layer (not shown). The inorganic protective layer may be a single film or a multi-layer film of $SiN_X$ and silicon oxide ($SiO_X$). The inorganic protective layer may be introduced to cover and protect some lines arranged on the first insulating layer IL1.

A second insulating layer IL2 and a third insulating layer IL3 are sequentially arranged to cover the source electrode, the drain electrode, the second data line DL2, and the clock line CWL, and each of the second insulating layer IL2 and the third insulating layer IL3 defines a contact hole for connecting the thin-film transistor TFT to a pixel electrode PXL.

The second insulating layer IL2 and the third insulating layer IL3 may include a film made of a single layer or multiple layers of an organic material, and may provide a flat front surface. The second insulating layer IL2 and the third insulating layer IL3 may include general-purpose polymers such as BCB, polyimide, HMDSO, PMMA, or PS, polymers having a phenolic group, acrylic polymers, imide polymers, aryl ether polymers, amide polymers, fluorine polymers, p-xylene polymers, vinyl alcohol polymers, and blends thereof.

The first data line DL1, a first electrode layer E1, and a second electrode layer E2 may be arranged on the second insulating layer IL2. The first electrode layer E1 and the second electrode layer E2 may be connected to the thin-film transistor TFT of the first pixel circuit unit PC1 and the thin-film transistor TFT of the second pixel circuit unit PC2, respectively, through contact holes defined in the second insulating layer IL2.

As shown in FIGS. 6 and 7, the first data line DL1 may be arranged on a different layer from the second data line DL2 and the clock line CWL, and the first data line DL1 may overlap the clock line CWL in a plan view. The first data line DL1 and the second data line DL2 may be arranged on different layers.

The first display element DE1 and the second display element DE2 may be arranged on the third insulating layer IL3. The first display element DE1 may include the first pixel electrode PXL1, the first intermediate layer IML1, and the opposite electrode OE, and the second display element DE2 may include the second pixel electrode PXL2, the second intermediate layer IML2, and the opposite electrode OE.

As illustrated in FIG. 6, the first display element DE1 may be arranged in the first area AR1 and may overlap the first gate driving circuit unit GDC1 in a plan view. The first display element DE1 may be connected to the thin-film transistor TFT of the first pixel circuit unit PC1 through the first contact hole CNT1 defined in the third insulating layer IL3. For example, the first pixel electrode PXL1 of the first display element DE1 may be connected to the first electrode layer E1 through the first contact hole CNT1 defined in the third insulating layer IL3, and the first electrode layer E1 may be connected to the thin-film transistor TFT of the first pixel circuit unit PC1 through a contact hole defined in the second insulating layer IL2.

The second display element DE2 may be arranged in the second area AR2. The second display element DE2 may be connected to the thin-film transistor TFT of the second pixel circuit unit PC2 through the second contact hole CNT2 defined in the third insulating layer IL3. For example, the second pixel electrode PXL2 of the second display element DE2 may be connected to the second electrode layer E2 through the second contact hole CNT2 defined in the third insulating layer IL3, and the second electrode layer E2 may be connected to the thin-film transistor TFT of the second pixel circuit unit PC2 through the contact hole defined in the second insulating layer IL2.

The pixel electrode PXL may be a semi-transmissive electrode or a reflective electrode. In some embodiments, the pixel electrode PXL may include a reflective layer formed of Ag, Mg, Al, Pt, Pd, Au, Ni, Nd, Ir, Cr, and compounds thereof, and a transparent or translucent electrode layer formed on the reflective layer. The transparent or translucent electrode layer may include at least one selected from the group consisting of indium tin oxide ("ITO"), indium zinc oxide ("IZO"), zinc oxide (ZnO), indium oxide ($In_2O_3$), and indium gallium oxide ("IGO"), and aluminum zinc oxide ("AZO"). In some embodiments, the pixel electrode PXL may be provided with ITO/Ag/ITO.

The pixel defining layer PDL may be arranged on the third insulating layer IL3. The pixel defining layer PDL increases the distance between an edge of the pixel electrode PXL and the opposite electrode OE above the pixel electrode PXL, thereby preventing arcing from occurring at the edge of the pixel electrode PXL. The pixel defining layer PDL may include the first opening OP1 exposing a portion of the first pixel electrode PXL1 and a second opening OP2 exposing a portion of the second pixel electrode PXL2. The first opening OP1 may define the first emission area EA1 of the first display element DE1, and the second opening OP2 may define the second emission area EA2 of the second display element DE2.

The pixel defining layer PDL may be composed of one or more organic insulating materials selected from the group consisting of polyimide, polyamide, acrylic resin, BCB, and phenol resin.

The first intermediate layer IML1 and the second intermediate layer IML2 may be arranged in the first opening OP1 and the second opening OP2 defined by the pixel defining layer PDL, respectively, and may include an organic emission layer. The organic emission layer may include an organic material including a fluorescent or phosphorescent material that emits red, green, blue, or white light. The organic emission layer may be a low-molecular organic material or a high-molecular organic material, and a hole transport layer ("HTL"), a hole injection layer ("HIL"), an electron transport layer ("ETL"), and an electron injection layer ("EIL") may be selectively arranged under and/or above the organic emission layer.

The opposite electrode OE may be a transmissive electrode or a reflective electrode. In some embodiments, the opposite electrode OE may be a transparent or translucent electrode, and may be formed of a metal thin film having a low work function including Li, Ca, LiF/Ca, LiF/Al, Al, Ag, Mg, and compounds thereof. In addition, a transparent conductive oxide ("TCO") film such as ITO, IZO, ZnO, or $In_2O_3$ may be further arranged above the metal thin film. The opposite electrode OE may be arranged on top of the first intermediate layer IML1 and the pixel defining layer PDL. The opposite electrode OE may be integrally formed with a plurality of organic light-emitting diodes OLED, and may correspond to the plurality of pixel electrodes PXL.

Because the organic light-emitting device can be easily damaged by moisture or oxygen from the outside, an encapsulation layer (not shown) may cover and protect the organic light-emitting device. The encapsulation layer may include a first inorganic encapsulation layer, an organic encapsulation layer, and/or a second inorganic encapsulation layer.

Figure 8:
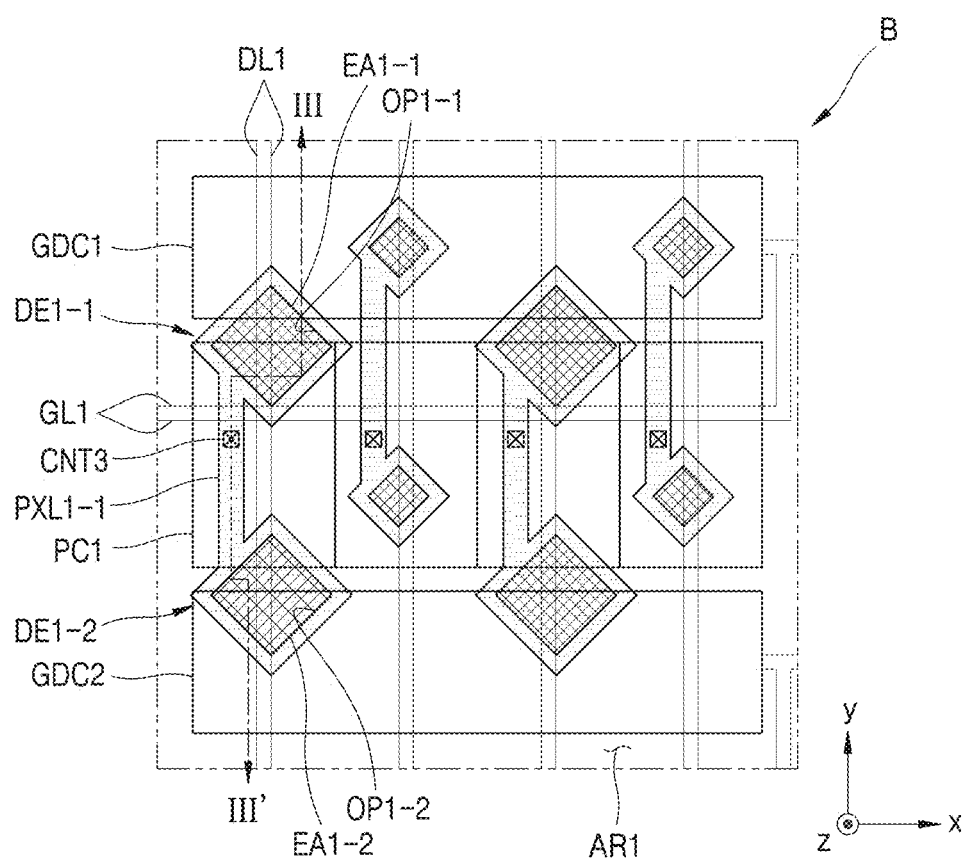
FIG. 8 is another exemplary enlarged plan view schematically illustrating part B of FIG. 5.
Figure 9:
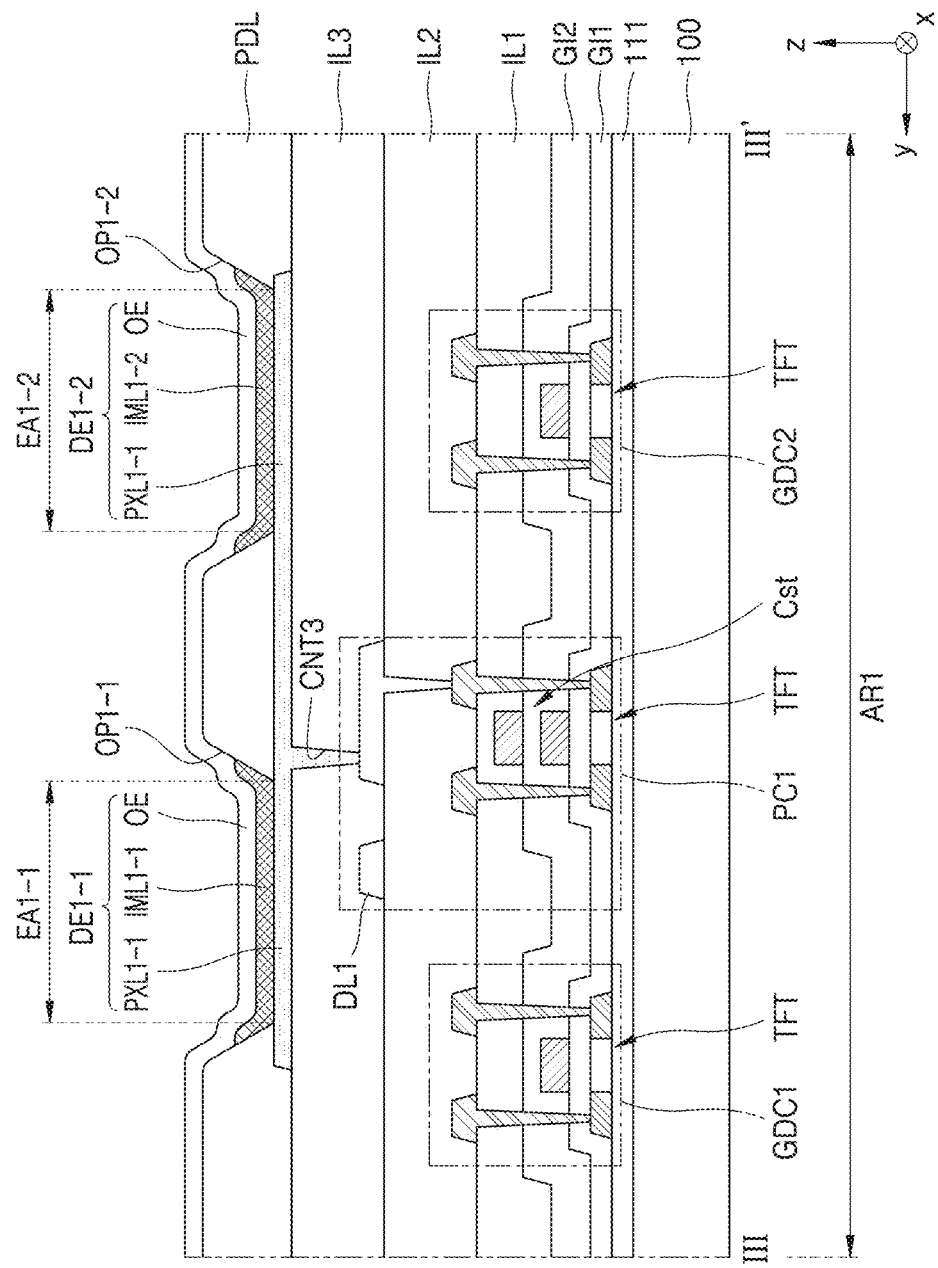
FIG. 9 is an exemplary cross-sectional view of the display panel of FIG. 8, taken along line III-III' in FIG. 8.

FIG. 8 is another exemplary enlarged plan view schematically illustrating part B of FIG. 5, and FIG. 9 is an exemplary cross-sectional view of the display panel of FIG. 8, taken along line III-III' in FIG. 8. In FIGS. 8 and 9, the same reference numerals as those in FIGS. 5 and 6 refer to the same members, and duplicate descriptions thereof will be omitted.

FIG. 8 is an enlarged view of the first area AR1 in FIG. 5. Referring to FIG. 8, the display apparatus 1 (see FIG. 1) may include the first gate driving circuit unit GDC1, the second gate driving circuit unit GDC2, the first pixel circuit unit PC1, the first data line DL1, and the first gate line GL1.

The first gate driving circuit unit GDC1 and the second gate driving circuit unit GDC2 may be arranged spaced apart from each other, and the first pixel circuit unit PC1 may be arranged between the first gate driving circuit unit GDC1 and the second gate driving circuit unit GDC2.

In an embodiment, as illustrated in FIGS. 8 and 9, the display apparatus 1 includes a $(1-1)^{st}$ display element DE1-1 and a $(1-2)^{nd}$ display element DE1-2 each electrically connected to the first pixel circuit unit PC1. The $(1-1)^{st}$ display element DE1-1 may at least partially overlap the first gate driving circuit unit GDC1 in a plan view, and the $(1-2)^{nd}$ display element DE1-2 may at least partially overlap the second gate driving circuit unit GDC2 in a plan view.

The $(1-1)^{st}$ display element DE1-1 and the $(1-2)^{nd}$ display element DE1-2 may be connected to the first pixel circuit unit PC1 through a third contact hole CNT3.

Referring to FIG. 9, the $(1-1)^{st}$ display element DE1-1 may include a $(1-1)^{st}$ pixel electrode PXL1-1, a $(1-1)^{st}$ intermediate layer IML1-1, and the opposite electrode OE, and the $(1-2)^{nd}$ display element DE1-2 may include the $(1-1)^{st}$ pixel electrode PXL1-1, a $(1-2)^{nd}$ intermediate layer IML1-2, and the opposite electrode OE. The $(1-1)^{st}$ display element DE1-1 and the $(1-2)^{nd}$ display element DE1-2 may share the $(1-1)^{st}$ pixel electrode PXL1-1. The $(1-1)^{st}$ intermediate layer IML1-1 and the $(1-2)^{nd}$ intermediate layer IML1-2 may each emit light in the same wavelength band. The $(1-1)^{st}$ display element DE1-1 and the $(1-2)^{nd}$ display element DE1-2 may each emit light in the same wavelength band.

As shown in FIGS. 8 and 9, the $(1-1)^{st}$ pixel electrode PXL1-1 may extend in the +y direction (i.e., left direction in FIG. 9) and −y direction (i.e., right direction in FIG. 9) from the third contact hole CNT3. A portion of the $(1-1)^{st}$ pixel electrode PXL1-1 extending in the +y direction may overlap the first gate driving circuit unit GDC1, and a portion of the $(1-1)^{st}$ pixel electrode PXL1-1 extending in the −y direction may overlap the second gate driving circuit unit GDC2 in a plan view.

The pixel defining layer PDL may define a $(1-1)^{st}$ opening OP1-1 exposing a portion of the $(1-1)^{st}$ pixel electrode PXL1-1 overlapping the first gate driving circuit unit GDC1, and a $(1-2)^{nd}$ opening OP1-2 exposing a portion of the $(1-1)^{st}$ pixel electrode PXL1-1 overlapping the second gate driving circuit unit GDC2 in a plan view. The $(1-1)^{st}$ opening OP1-1 and the $(1-2)^{nd}$ opening OP1-2 may define a $(1-1)^{st}$ emission area EA1-1 of the $(1-1)^{st}$ display element DE1-1 and a $(1-2)^{nd}$ emission area EA1-2 of the $(1-2)^{nd}$ display element DE1-2, respectively.

The $(1-1)^{st}$ emission area EA1-1 defined by the $(1-1)^{st}$ opening OP1-1 may be located in the +y direction relative to the third contact hole CNT3 and may overlap the first gate driving circuit unit GDC1 in a plan view. The $(1-2)^{nd}$ emission area EA1-2 defined by the $(1-2)^{nd}$ opening OP1-2 may be located in the −y direction relative to the third contact hole CNT3 and may overlap the second gate driving circuit unit GDC2 in a plan view.

The size of the $(1-1)^{st}$ opening OP1-1 and the size of the $(1-2)^{nd}$ opening OP1-2 may be the same. The area of the $(1-1)^{st}$ emission area EA1-1 and the area of the $(1-2)^{nd}$ emission area EA1-2 may be the same.

Figure 10:
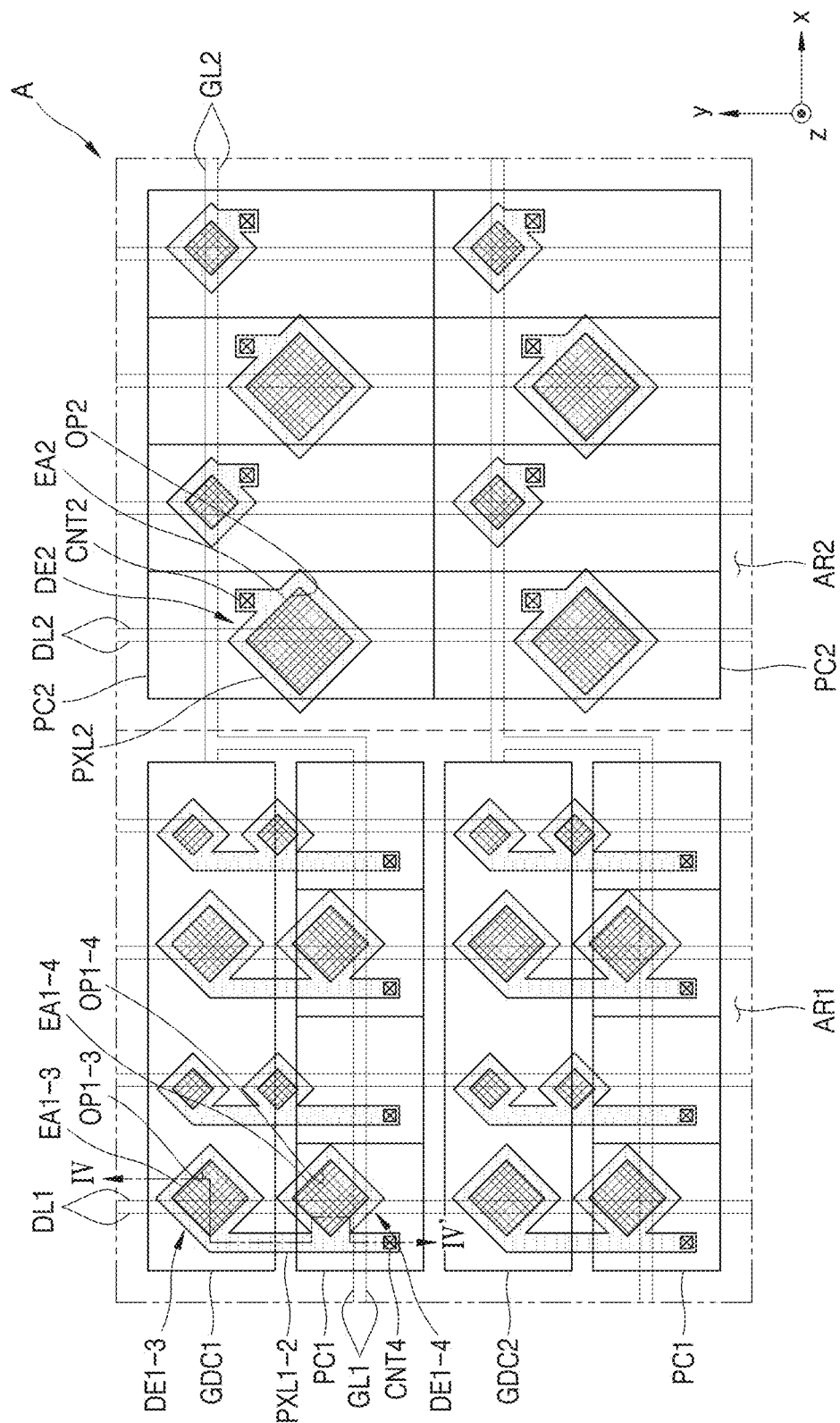
FIG. 10 is another exemplary enlarged plan view schematically illustrating part A of FIG. 2.
Figure 11:
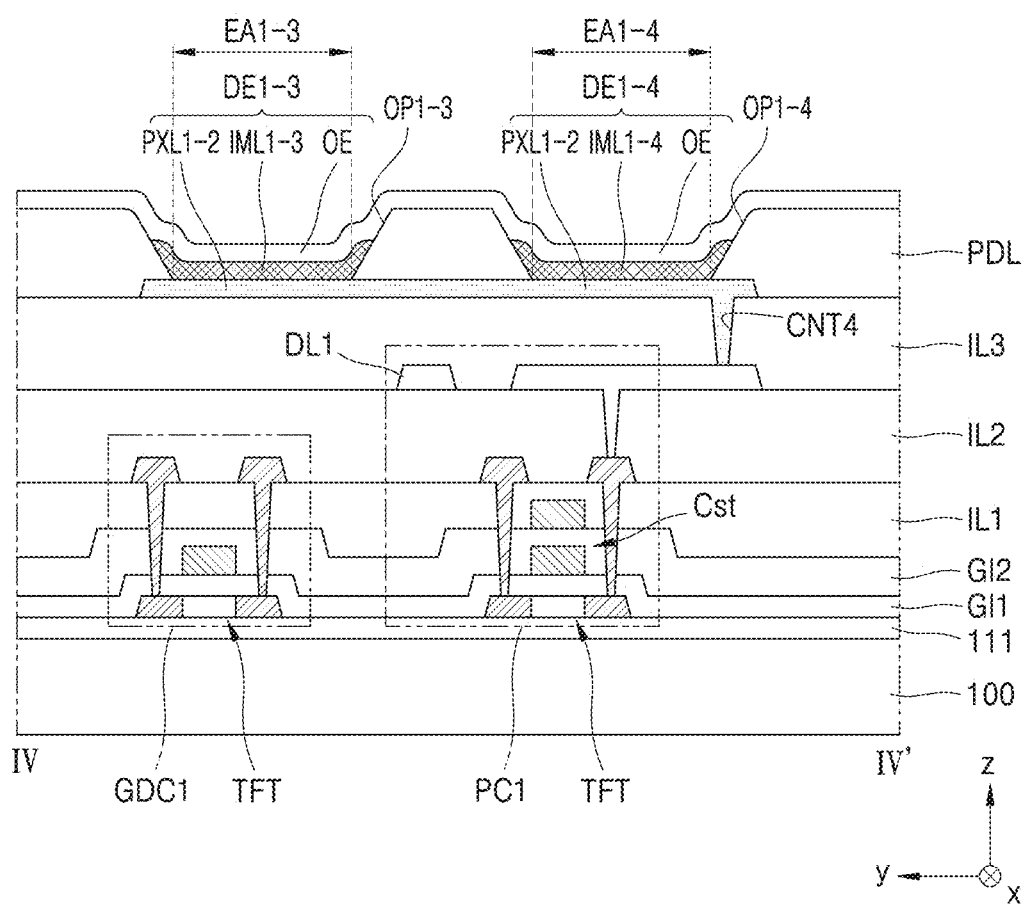
FIG. 11 is an exemplary cross-sectional view of the display panel of FIG. 10, taken along line IV-IV' in FIG. 10.

FIG. 10 is another exemplary enlarged plan view schematically illustrating part A of FIG. 2, and FIG. 11 is an exemplary cross-sectional view of the display panel of FIG. 10, taken along line IV-IV' in FIG. 10. In FIGS. 10 and 11, the same reference numerals as those in FIGS. 5 and 6 refer to the same members, and duplicate descriptions thereof will be omitted.

Referring to FIG. 10, the display apparatus 1 (see FIG. 1) may include a first gate driving circuit unit GDC1, a second gate driving circuit unit GDC2, a first pixel circuit unit PC1, a second pixel circuit unit PC2, a first data line DL1, a second data line DL2, a first gate line GL1, and a second gate line GL2.

The first gate driving circuit unit GDC1 and the second gate driving circuit unit GDC2 may be arranged spaced apart from each other, and the first pixel circuit unit PC1 may be arranged between the first gate driving circuit unit GDC1 and the second gate driving circuit unit GDC2.

In an embodiment, as illustrated in FIG. 10, the display apparatus 1 may include a $(1-3)^{rd}$ display element DE1-3 and a $(1-4)^{th}$ display element DE1-4 each electrically connected to the first pixel circuit unit PC1. The $(1-3)^{rd}$ display element DE1-3 may at least partially overlap the first gate driving circuit unit GDC1 in a plan view, and the $(1-4)^{th}$ display element DE1-4 may at least partially overlap the first pixel circuit unit PC1. A portion of the $(1-4)^{th}$ display element DE1-4 may overlap the first gate driving circuit unit GDC1. The display apparatus 1 may include the second display element DE2 electrically connected to the second pixel circuit unit PC2.

The $(1-3)^{rd}$ display element DE1-3 and the $(1-4)^{th}$ display element DE1-4 may be connected to the first pixel circuit unit PC1 through a fourth contact hole CNT4. The second display element DE2 may be connected to the second pixel circuit unit PC2 through the second contact hole CNT2.

Referring to FIG. 11, the $(1-3)^{rd}$ display element DE1-3 may include a $(1-2)^{nd}$ pixel electrode PXL1-2, a $(1-3)^{rd}$ intermediate layer IML1-3, and an opposite electrode OE, and the $(1-4)^{th}$ display element DE1-4 may include a $(1-2)^{nd}$ pixel electrode PXL1-2, a $(1-4)^{th}$ intermediate layer IML1-4, and an opposite electrode OE. The $(1-3)^{rd}$ display element DE1-3 and the $(1-4)^{th}$ display element DE1-4 may share the $(1-2)^{nd}$ pixel electrode PXL1-2. The $(1-3)^{rd}$ intermediate layer IML1-3 and a $(1-4)^{th}$ intermediate layer IML1-4 may each emit light in the same wavelength band. The $(1-3)^{rd}$ display element DE1-3 and the $(1-4)^{th}$ display element DE1-4 may each emit light in the same wavelength band.

As shown in FIGS. 10 and 11, the $(1-2)^{nd}$ pixel electrode PXL1-2 may extend in the +y direction from the fourth contact hole CNT4. A portion of the $(1-2)^{nd}$ pixel electrode PXL1-2 extending in the +y direction may overlap the first gate driving circuit unit GDC1 in a plan view, and the other portion of the $(1-2)^{nd}$ pixel electrode PXL1-2 may overlap the first pixel circuit unit PC1.

As another example, the $(1-2)^{nd}$ pixel electrode PXL1-2 may extend in the −y direction from the fourth contact hole CNT4. A portion of the $(1-2)^{nd}$ pixel electrode PXL1-2 extending in the −y direction may overlap the second gate driving circuit unit GDC2, and the other portion of the $(1-2)^{nd}$ pixel electrode PXL1-2 may overlap the first pixel circuit unit PC1.

The pixel defining layer PDL may include a $(1-3)^{rd}$ opening OP1-3 and a $(1-4)^{th}$ opening OP1-4, the $(1-3)^{rd}$ opening OP1-3 exposing a portion of the $(1-2)^{nd}$ pixel electrode PXL1-2 overlapping the first gate driving circuit unit GDC1 and the $(1-4)^{th}$ opening OP1-4 exposing a portion of the $(1-2)^{nd}$ pixel electrode PXL1-2 overlapping the first pixel circuit unit PC1 in a plan view. The $(1-3)^{rd}$ opening OP1-3 and the $(1-4)^{th}$ opening OP1-4 may define a $(1-3)^{rd}$ emission area EA1-3 of the $(1-3)^{rd}$ display element DE1-3 and a $(1-4)^{th}$ emission area EA1-4 of the $(1-4)^{th}$ display element DE1-4, respectively.

In addition, the pixel defining layer PDL may further include the second opening OP2 exposing a portion of the second pixel electrode PXL2, and the second opening OP2 may define the second emission area EA2 of the second display element DE2.

Each of the $(1-3)^{rd}$ emission area EA1-3 defined by the $(1-3)^{rd}$ opening OP1-3 and the $(1-4)^{th}$ emission area EA1-4 defined by the $(1-4)^{th}$ opening OP1-4 may be positioned in +y direction based on the fourth contact hole CNT4. As another example, the $(1-3)^{rd}$ emission area EA1-3 and the $(1-4)^{th}$ emission area EA1-4 may be located in the −y direction based on the fourth contact hole CNT4.

The size of the $(1-3)^{rd}$ opening OP1-3 and the size of the $(1-4)^{th}$ opening OP1-4 may be the same. The area of the $(1-3)^{rd}$ emission area EA1-3 and the area of the $(1-4)^{th}$ emission area EA1-4 may be the same.

As illustrated in FIG. 10, the size of the $(1-3)^{rd}$ opening OP1-3 may be less than the size of the second opening OP2. The size of the $(1-4)^{th}$ opening OP1-4 may be less than the size of the second opening OP2. The area of the $(1-3)^{rd}$ emission area EA1-3 may be less than that of the second emission area EA2. The area of the $(1-4)^{th}$ emission area EA1-4 may be less than that of the second emission area EA2.

Figure 12:
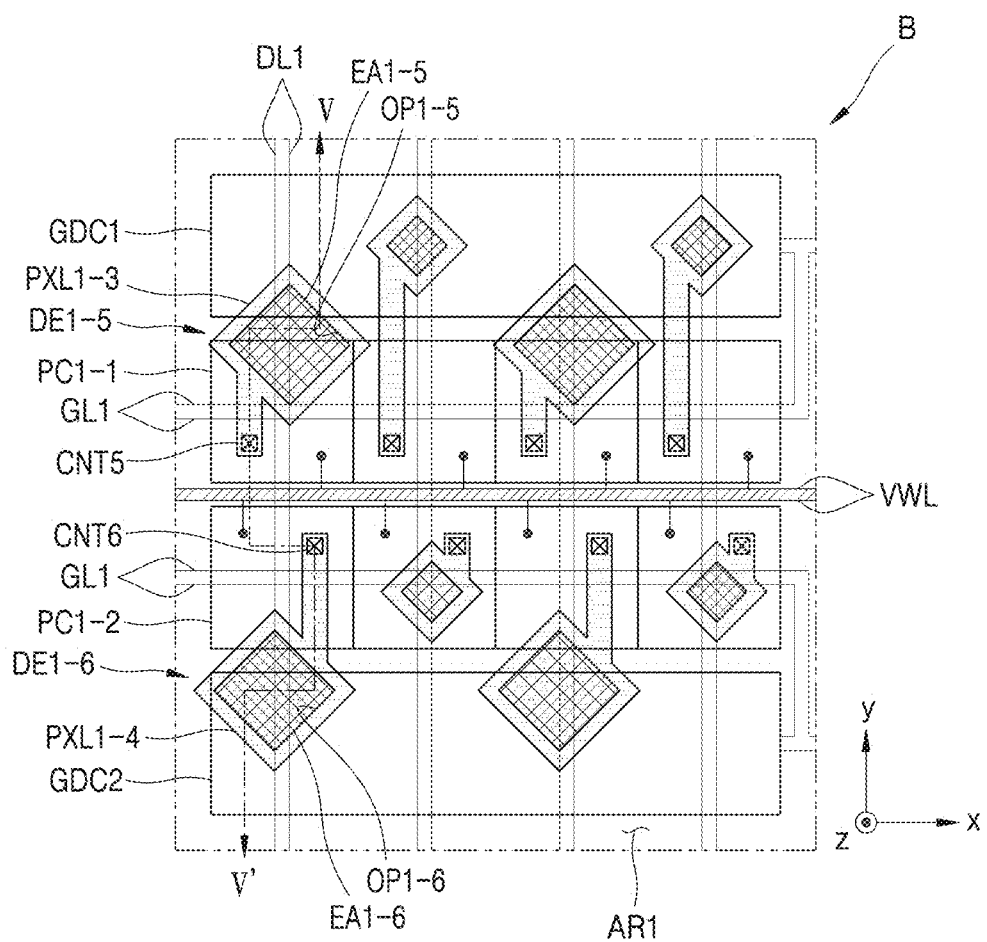
FIG. 12 is another exemplary enlarged plan view schematically illustrating part B of FIG. 5.
Figure 13:
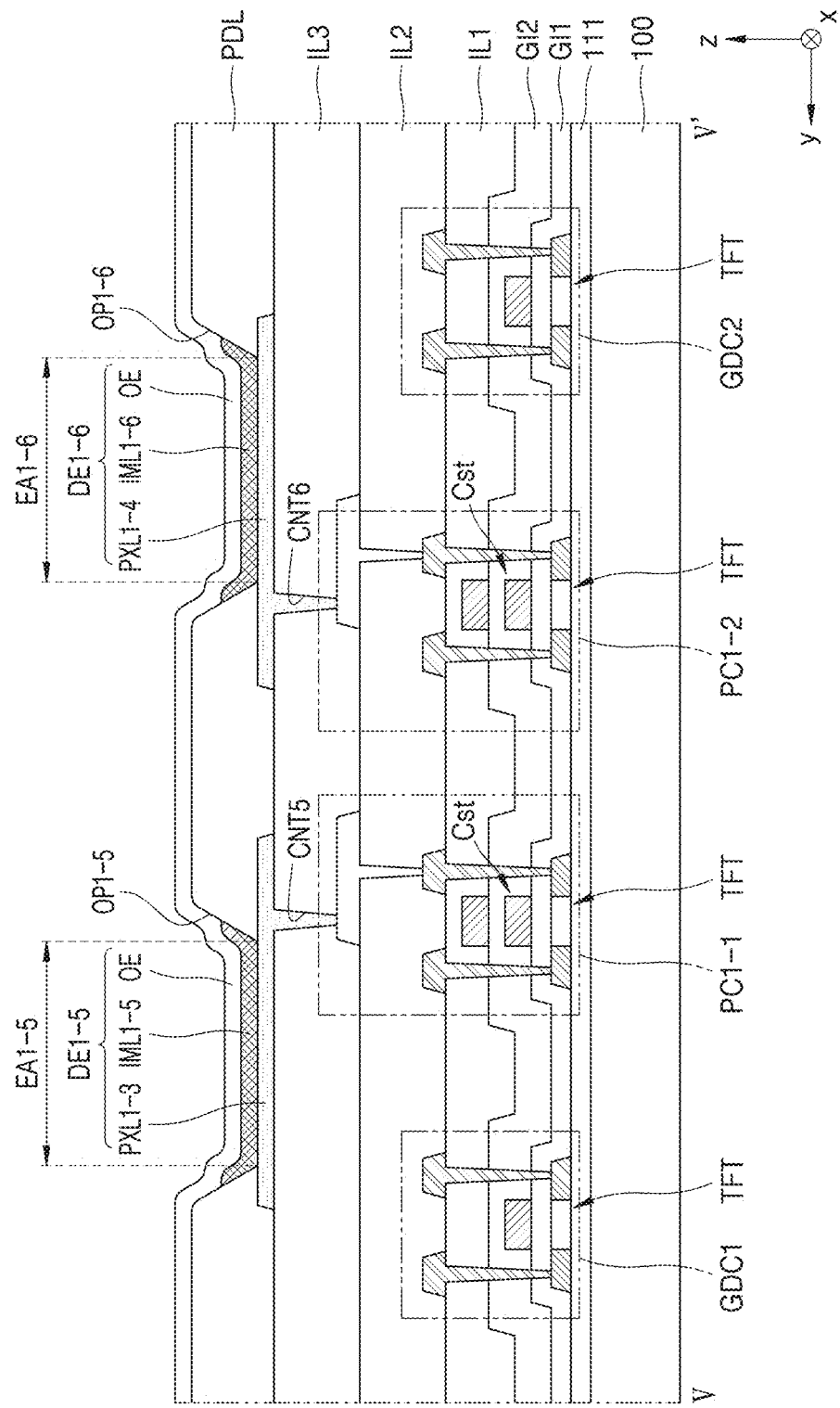
FIG. 13 is an exemplary cross-sectional view of the display panel of FIG. 12, taken along line V-V' in FIG. 12.

FIG. 12 is another exemplary enlarged plan view schematically illustrating part B of FIG. 5, and FIG. 13 is an exemplary cross-sectional view of the display panel of FIG. 12, taken along line V-V' in FIG. 12. In FIGS. 12 and 13, the same reference numerals as those in FIGS. 5 and 6 refer to the same members, and duplicate descriptions thereof will be omitted.

FIG. 12 is an enlarged view of the first area AR1 in FIG. 5. Referring to FIG. 12, the display apparatus 1 (see FIG. 1) may include the first gate driving circuit unit GDC1, the second gate driving circuit unit GDC2, a $(1-1)^{st}$ pixel circuit unit PC1-1, a $(1-2)^{nd}$ pixel circuit unit PC1-2, a voltage line VWL, the first data line DL1, and the first gate line GL1.

The first gate driving circuit unit GDC1 and the second gate driving circuit unit GDC2 may be arranged spaced apart from each other, and the $(1-1)^{st}$ pixel circuit unit PC1-1 may be arranged between the first gate driving circuit unit GDC1 and the second gate driving circuit unit GDC2. The $(1-2)^{nd}$ pixel circuit unit PC1-2 may be arranged between the $(1-1)^{st}$ pixel circuit unit PC1-1 and the second gate driving circuit unit GDC2.

The voltage line VWL may be arranged between the $(1-1)^{st}$ pixel circuit unit PC1-1 and the $(1-2)^{nd}$ pixel circuit unit PC1-2. The voltage line VWL may be connected to each of the $(1-1)^{st}$ pixel circuit unit PC1-1 and the $(1-2)^{nd}$ pixel circuit unit PC1-2. The voltage line VWL may be an initialization voltage line or a driving voltage line. When the voltage line VWL is arranged between the $(1-1)^{st}$ pixel circuit unit PC1-1 and the $(1-2)^{nd}$ pixel circuit unit PC1-2, voltage may be applied to two pixel circuit units arranged in different rows, through one voltage line VWL. Therefore, the area occupied by the voltage line VWL for applying voltage to the pixel circuit units can be significantly reduced.

In an embodiment, as shown in FIG. 12, the display apparatus 1 may include a $(1-5)^{th}$ display element DE1-5 and a $(1-6)^{th}$ display element DE1-6, where the $(1-5)^{th}$ display element DE1-5 is electrically connected to the $(1-1)^{st}$ pixel circuit unit PC1-1 and the $(1-6)^{th}$ display element DE1-6 is electrically connected to the $(1-2)^{nd}$ pixel circuit unit PC1-2. The $(1-5)^{th}$ display element DE1-5 may at least partially overlap the first gate driving circuit unit GDC1, and the $(1-6)^{th}$ display element DE1-6 may at least partially overlap the second gate driving circuit unit GDC2 in a plan view.

The $(1-5)^{th}$ display element DE1-5 may be connected to the $(1-1)^{st}$ pixel circuit unit PC1-1 through a fifth contact hole CNT5, and the $(1-6)^{th}$ display element DE1-6 may be connected to the $(1-2)^{nd}$ pixel circuit unit PC1-2 through a sixth contact hole CNT6.

Referring to FIG. 13, the $(1-5)^{th}$ display element DE1-5 may include a $(1-3)^{rd}$ pixel electrode PXL1-3, a $(1-5)^{th}$ intermediate layer IML1-5, and an opposite electrode OE, and the $(1-6)^{th}$ display element DE1-6 may include a $(1-4)^{th}$ pixel electrode PXL1-4, a $(1-6)^{th}$ intermediate layer IML1-6, and an opposite electrode OE.

As shown in FIGS. 12 and 13, the $(1-3)^{rd}$ pixel electrode PXL1-3 may extend in the +y direction from the fifth contact hole CNT5. A portion of the $(1-3)^{rd}$ pixel electrode PXL1-3 extending in the +y direction may overlap the first gate driving circuit unit GDC1. The $(1-4)^{th}$ pixel electrode PXL1-4 may extend from the sixth contact hole CNT6 in the −y direction. A portion of the $(1-4)^{th}$ pixel electrode PXL1-4 extending in the −y direction may overlap the second gate driving circuit unit GDC2 in a plan view.

The pixel defining layer PDL may include a $(1-5)^{th}$ opening OP1-5 and a $(1-6)^{th}$ opening OP1-6, the $(1-5)^{th}$ opening OP1-5 exposing a portion of the $(1-3)^{rd}$ pixel electrode PXL1-3 overlapping the first gate driving circuit unit GDC1 and the $(1-6)^{th}$ opening OP1-6 exposing a portion of the $(1-4)^{th}$ pixel electrode PXL1-4 overlapping the second gate driving circuit unit GDC2 in a plan view. The $(1-5)^{th}$ opening OP1-5 and the $(1-6)^{th}$ opening OP1-6 may define a $(1-5)^{th}$ emission area EA1-5 of the $(1-5)^{th}$ display element DE1-5 and a $(1-6)^{th}$ emission area EA1-6 of the $(1-6)^{th}$ display element DE1-6, respectively.

The $(1-5)^{th}$ emission area EA1-5 defined by the $(1-5)^{th}$ opening OP1-5 may be located in the +y direction relative to the fifth contact hole CNT5 and may overlap the first gate driving circuit unit GDC1. The $(1-6)^{th}$ emission area EA1-6 defined by the $(1-6)^{th}$ opening OP1-6 may be located in the −y direction relative to the sixth contact hole CNT6 and may overlap the second gate driving circuit unit GDC2 in a plan view.

The size of the $(1-5)^{th}$ opening OP1-5 and the size of the $(1-6)^{th}$ opening OP1-6 may be the same. The area of the $(1-5)^{th}$ emission area EA1-5 and the area of the $(1-6)^{th}$ emission area EA1-6 may be the same.

Figure 14:
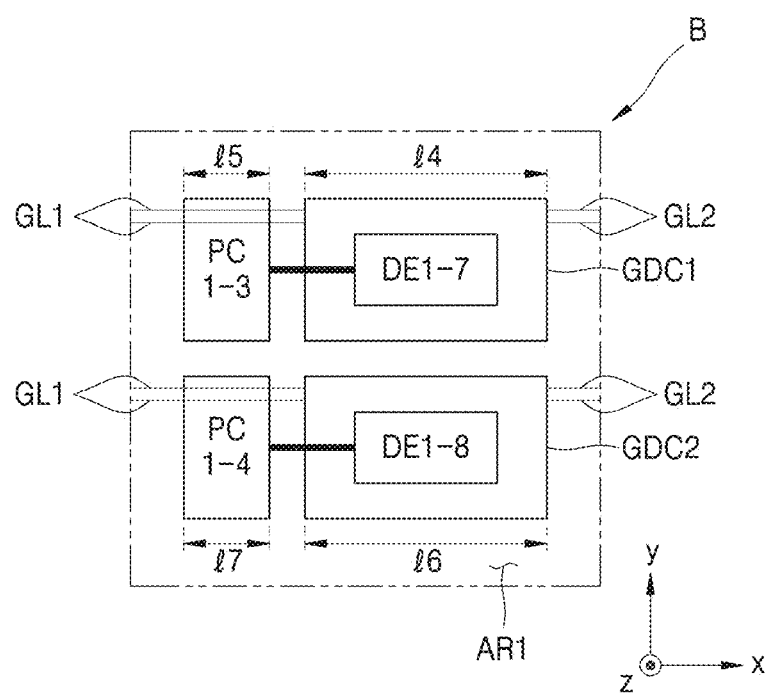
FIG. 14 is another enlarged plan view schematically illustrating part B of FIG. 5.
Figure 15:
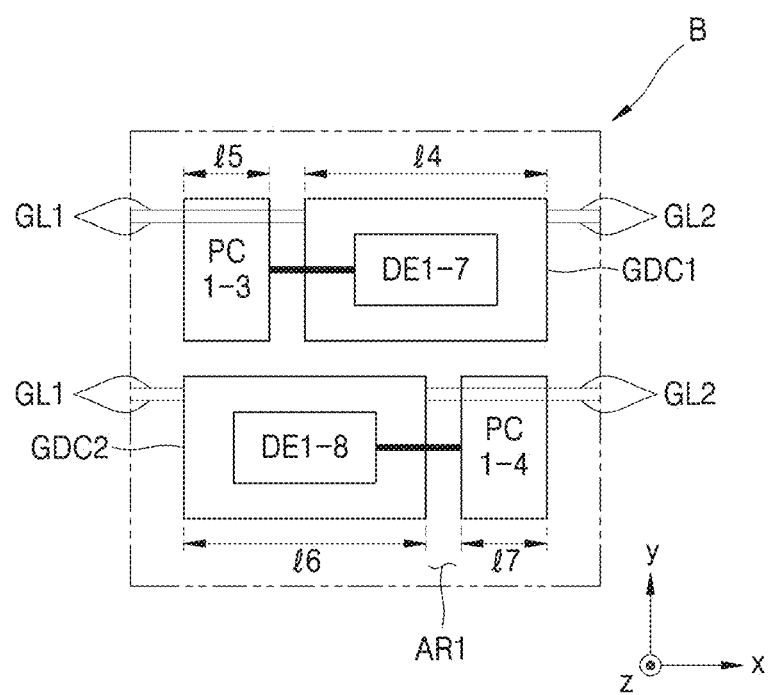
FIG. 15 is another enlarged plan view schematically illustrating part B of FIG. 5.

FIGS. 14 and 15 are another enlarged plan views schematically illustrating part B of FIG. 5.

FIGS. 14 and 15 are enlarged views of the first area AR1 in FIG. 5. Referring to FIGS. 14 and 15, the display apparatus 1 (see FIG. 1) may include the first gate driving circuit unit GDC1, the second gate driving circuit unit GDC2, a $(1-3)^{rd}$ pixel circuit unit PC1-3, a $(1-4)^{th}$ pixel circuit unit PC1-4, the first gate line GL1, and the second gate line GL2.

The first gate line GL1 and the second gate line GL2 may be connected to the first gate driving circuit unit GDC1 and may be synchronized with each other. The first gate line GL1 and the second gate line GL2 may each include an emission control line and a scan line. The first gate line GL1 may extend in −x direction, and the second gate line GL2 may extend in +x direction.

In an embodiment, as shown in FIGS. 14 and 15, the sum of a length $\ell 4$ of the first gate driving circuit unit GDC1 for the second direction and a length $\ell 5$ of the $(1-3)^{rd}$ pixel circuit unit PC1-3 for the second direction may be equal to the sum of a length $\ell 6$ of the second gate driving circuit unit GDC2 for the second direction and a length 7 of the $(1-4)^{th}$ pixel circuit unit PC1-4 for the second direction.

The display apparatus 1 may include a $(1-7)^{th}$ display element DE1-7 electrically connected to the $(1-3)^{rd}$ pixel circuit unit PC1-3, and a $(1-8)^{th}$ display element DE1-8 electrically connected to the $(1-4)^{th}$ pixel circuit unit PC1-4. The $(1-7)^{th}$ display element DE1-7 may at least partially overlap the first gate driving circuit unit GDC1, and the $(1-8)^{th}$ display element DE1-8 may at least partially overlap the second gate driving circuit unit GDC2 in a plan view.

In an embodiment, as shown in FIG. 14, the $(1-3)^{rd}$ pixel circuit unit PC1-3 may be arranged closer to the outside of the substrate 100 than the first gate driving circuit unit GDC1 in the second direction (i.e., x direction). The $(1-4)^{th}$ pixel circuit unit PC1-4 may be arranged closer to the outside of the substrate 100 than the second gate driving circuit unit GDC2 in the second direction (i.e., x direction). The $(1-3)^{rd}$ pixel circuit unit PC1-3 and the $(1-4)^{th}$ pixel circuit unit PC1-4 may be arranged side by side in the y direction (i.e., the first direction).

As another example, as illustrated in FIG. 15, the $(1-3)^{rd}$ pixel circuit unit PC1-3 and the $(1-4)^{th}$ pixel circuit unit PC1-4 may not be arranged side by side in the y direction. The $(1-3)^{rd}$ pixel circuit unit PC1-3 may be placed closer to the outside of the substrate 100 than the first gate driving circuit unit GDC1 in the second direction (i.e., x direction), but the $(1-4)^{th}$ pixel circuit unit PC1-4 may not be arranged closer to the outside of the substrate 100 than the second gate driving circuit unit GDC2 in the second direction (i.e., x direction). The second gate driving circuit unit GDC2 may be arranged closer to the outside of the substrate 100 than the $(1-4)^{th}$ pixel circuit unit PC1-4. The $(1-4)^{th}$ pixel circuit unit PC1-4 may be arranged closer to the second area AR2 of the substrate 100 than the second gate driving circuit unit GDC2 in the second direction (i.e., x direction).

In the display apparatus 1 according to an embodiment, the plurality of first pixels PX1 may be arranged in the first area AR1 to correspond to a peripheral area of the substrate 100. As a result, an area for displaying an image may increase from the second area AR2 in which the plurality of second pixels PX2 is arranged to the first area AR1 in which the plurality of first pixels PX1 is arranged.

So far, only display apparatuses have been mainly described, but embodiments are not limited thereto. For example, it can be said that a method for manufacturing a display apparatus also falls within the scope of the disclosure to manufacture such a display apparatus.

According to an embodiment as described above, it is possible to implement a display apparatus in which a non-display area is reduced. The scope of embodiments is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate comprising a first area and a second area surrounded by the first area;
    a first gate driving circuit unit and a second gate driving circuit unit arranged adjacent to and spaced apart from each other in the first area;
    a $(1-1)^{st}$ pixel circuit unit including at least one transistor and arranged between the first gate driving circuit unit and the second gate driving circuit unit in and
    a $(1-1)^{st}$ display element arranged in the first area and electrically connected to the $(1-1)^{st}$ pixel circuit unit.

2. The display apparatus of claim 1, wherein the $(1-1)^{st}$ display element at least partially overlaps the first gate driving circuit unit in a plan view.

3. The display apparatus of claim 1, further comprising:
    a second pixel circuit unit arranged in the second area; and
    a second display element arranged in the second area and electrically connected to the second pixel circuit unit.

4. The display apparatus of claim 3, further comprising a data line arranged on the substrate and extending in a first direction,
    wherein a sum of a length of the first gate driving circuit unit in the first direction and a length of the $(1-1)^{st}$ pixel circuit unit in the first direction is less than or equal to a length of the second pixel circuit unit in the first direction.

5. The display apparatus of claim 1, further comprising:
    a first gate line connected to the first gate driving circuit unit and extending in the first area; and
    a second gate line connected to the first gate driving circuit unit and extending in the second area.

6. The display apparatus of claim 1, further comprising a $(1-2)^{nd}$ di splay element arranged in the first area and electrically connected to the $(1-1)^{st}$ pixel circu it unit.

7. The display apparatus of claim 6, wherein the $(1-1)^{st}$ display ele ment at least partially overlaps the first gate driving circuit unit in a plan view, and
    the $(1-2)^{nd}$ display element at least partially overlaps the second gate driving circuit unit in the plan view.

8. The display apparatus of claim 6, wherein the $(1-1)^{st}$ display ele ment at least partially overlaps the first gate driving circuit unit in a plan view, and
    the $(1-2)^{nd}$ display element at least partially overlaps the $(1-1)^{st}$ pixel circuit unit in the plan view.

9. The display apparatus of claim 6, wherein the $(1-1)^{st}$ display ele ment and the $(1-2)^{st}$ display element each emit light in the same wavelength band.

10. The display apparatus of claim 1, further comprising:
    a $(1-2)^{nd}$ pixel circuit unit arranged between the $(1-1)^{st}$ pixel circuit unit and the second gate driving circuit unit; and
    a $(1-3)^{rd}$ display element electrically connected to the $(1-2)^{nd}$ pixel circuit unit,
    wherein the $(1-1)^{st}$ display element at least partially overlaps the first gate driving circuit unit in a plan view, and
    the $(1-3)^{rd}$ display element at least partially overlaps the second gate driving circuit unit in the plan view.

11. The display apparatus of claim 10, further comprising a voltage line arranged between the $(1-1)^{st}$ pixel circuit unit and the $(1-2)^{nd}$ pixel circuit unit,
   wherein the voltage line is connected to each of the $(1-1)^{st}$ pixel circuit unit and the $(1-2)^{nd}$ pixel circuit unit.

12. The display apparatus of claim 1, wherein the $(1-1)^{st}$ display ele ment comprises a $(1-1)^{st}$ pixel electrode, a $(1-1)^{st}$ intermediate layer, and an opposite elect rode,
   the display apparatus further comprises a pixel defining layer between the $(1-1)^{st}$ pixel electrode and the opposite electrode,
   wherein the pixel defining layer defines a $(1-1)^{st}$ opening defining a $(1-1)^{st}$ emission area of the $(1-1)^{st}$ display element by exposing a portion of the $(1-1)^{st}$ pixel electrode, and
   the first gate driving circuit unit at least partially overlaps the $(1-1)^{st}$ emission area in a plan view.

13. The display apparatus of claim 12, further comprising a $(1-2)^{nd}$ display element arranged in the first area and electrically connected to the $(1-1)^{st}$ pixel cir cuit unit,
   wherein the pixel defining layer further defines a $(1-2)^{nd}$ opening defining a $(1-2)^{nd}$ emission area of the $(1-2)^{nd}$ display element by exposing a portion of the $(1-1)^{st}$ pixel electrode, and
   the $(1-2)^{nd}$ emission area at least partially overlaps one of the $(1-1)^{st}$ pixel circuit unit or the second gate driving circuit unit in the plan view.

14. The display apparatus of claim 13, further comprising:
   a second pixel circuit unit arranged on the substrate to correspond to the second area; and
   a second display element electrically connected to the second pixel circuit unit, wherein the second display element comprises a second pixel electrode, a second intermediate layer, and the opposite electrode in the second area,
   wherein the pixel defining layer further defines a second opening defining a second emission area of the second display element by exposing a portion of the second pixel electrode, and
   a size of the $(1-1)^{st}$ opening is less than a size of the second opening.

15. A display apparatus comprising:
   a substrate comprising a first area and a second area surrounded by the first area;
   a first gate driving circuit unit arranged in the first area;
   a $(1-1)^{st}$ pixel circuit unit arranged in the first area and closer to an outside of the substrate than the first gate driving circuit unit in a second
   a $(1-1)^{st}$ display element arranged in the first area and electrically connected to the $(1-1)^{st}$ pixel circuit unit,
   a second gate driving circuit unit in the first area;
   a $(1-2)^{nd}$ pixel circuit unit arranged in the first area and closer to the second area than the second gate driving circuit unit; and
   a $(1-2)^{nd}$ display element arranged in the first area and electrically connected to the $(1-2)^{nd}$ pixel circuit unit,
   wherein a sum of a length of the first gate driving circuit unit in the second direction and a length of the $(1-1)^{st}$ pixel circuit unit in the second direction is equal to a sum of a length of the second gate driving circuit unit and a length of the $(1-2)^{nd}$ pixel circuit unit in the second direction.

16. The display apparatus of claim 15, wherein the $(1-1)^{st}$ display el ement at least partially overlaps the first gate driving circuit unit in a plan view.

17. The display apparatus of claim 15, wherein the $(1-1)^{st}$ display element at least partially overlaps the first gate driving circuit unit in a plan view, and
   the $(1-2)^{nd}$ display element at least partially overlaps the second gate driving circuit unit in the plan view.

18. The display apparatus of claim 15, further comprising:
   a first gate line connected to the first gate driving circuit unit and extended toward the outside of the substrate in the second direction; and
   a second gate line connected to the first gate driving circuit unit and extended toward the second area in the second direction.

* * * * *